(12) United States Patent
Suzuki et al.

(10) Patent No.: US 6,910,898 B2
(45) Date of Patent: Jun. 28, 2005

(54) SOCKET FOR SEMICONDUCTOR DEVICE

(75) Inventors: Takeyuki Suzuki, Yokohama (JP);
Noriyuki Matsuoka, Yokohama (JP);
Yoshinori Wakabayashi, Tokyo (JP);
Toshitaka Kuroda, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/614,196

(22) Filed: Jul. 8, 2003

(65) Prior Publication Data
US 2004/0009682 A1 Jan. 15, 2004

(30) Foreign Application Priority Data

Jul. 9, 2002 (JP) .......................................... 2002-200459
Jan. 10, 2003 (JP) .......................................... 2003-004977

(51) Int. Cl.[7] .............................................. H01R 12/00
(52) U.S. Cl. ............................................ 439/73; 439/66
(58) Field of Search .............................. 439/72, 71, 70, 439/73, 493, 66, 331, 91, 330; 216/18, 20; 438/17, 18

(56) References Cited

U.S. PATENT DOCUMENTS 6,439,897 B1 * 8/2002 Ikeya .......................... 439/73

FOREIGN PATENT DOCUMENTS

JP          9-017539          1/1997

* cited by examiner

Primary Examiner—Alexander Gilman
(74) Attorney, Agent, or Firm—Finnegan, Henderson, Farabow, Garrett & Dunner, LLP

(57) ABSTRACT

The cap body of the pressing cap has lamellar pieces for pressing portions of the substrate in the contact sheet, in which ends of the respective sides of the bare chip are positioned.

20 Claims, 23 Drawing Sheets

SOCKET FOR SEMICONDUCTOR DEVICE

This application claims priority from Japanese Patent Application No. 2002-200459 filed Jul. 9, 2002 and 2003-004977 filed Jan. 10, 2003, which are incorporated hereinto by reference.

BACKGROUND OF THE INVENTION

1. Field of the Invention

The present invention relates to a socket for a semiconductor device, having a contact sheet.

2. Description of the Related Art

A semiconductor device mounted for an electronic equipment or others has been subjected to various tests prior to being mounted to the latter so that latent defects are removed. Such tests are carried out in a non-destructive manner including tests in which a voltage stress is applied thereto, or it is operated or stocked in a high temperature environment in correspondence to the thermal and mechanical environmental tests or the like. Of these various tests, a burn-in test in which the operation test is carried out in a high-temperature condition for a predetermined period is particularly effective for removing integrated circuits causing infant mortality failures.

A test jig used for this burn-in test is generally called as an IC socket. As disclosed in a specification of Japanese Patent Application No. 2002-200459 and Japanese Patent Application Laid-open No. 9-017539 (1997), in a test for KGD (Known Good Die) which is a non-defective bare chip passing the preceding test, it is advanced a suggestion that such a bare chip is accommodated in an accommodation portion of the IC socket by a carrier detachably mounted thereto.

As shown, for example, in FIG. 20, the carrier unit is comprised of a carrier housing 2 having a accommodation portion 2A for accommodating a bare chip 12, a contact sheet 6 located on the inner bottom wall of the accommodation portion 2A in the carrier housing 2 via an elastic sheet 4, a pressing cap 14 for pressing an electrode group in the bare chip 12 onto a bump group 6B of the contact sheet 6, and a latch mechanism 10 for selectively holding the pressing cap 14 relative to the carrier housing 2.

The contact sheet 6 has the bump group including a plurality of bumps 6B formed of copper or others opposed to the electrode group in the bare chip 12 to be electrically connected, as shown in FIG. 20. In FIG. 20, two bumps 6B of which are illustrated in an exaggerated manner as representative thereof. The plurality of bumps 6B are arranged in a frame shape in correspondence to the electrode group. A tip end of the respective bump projects from a surface of the contact sheet 6 by a predetermined height level. In this regard, in FIG. 21, of which two bumps 6B are shown as representative of the group thereof for the purpose of simplifying the drawing.

The pressing cap 14 is comprised of a pressing body 16 having a pressing surface to be brought into contact with a surface facing a surface of the bare chip 12 on which the electrode group are formed, a cap body 20 accommodating a base portion of the pressing body 16, and a plurality of springs 18 disposed in a space between the base portion of the pressing body 16 and the inner surface of a recess in the cap body 20, for biasing the pressing body 16 toward the bare chip 12.

The base portion of the pressing body 16 has hooks on the outer periphery thereof and inserted into the recess of the cap body 20 in a movable manner. The cap body 20 has step height 20N on the outer surfaces at opposite ends thereof, with which tip ends of hook members 10FA and 10FB of the latch mechanism 10 are engaged, as shown in FIG. 20.

The latch mechanism 10 is comprised of the hook members 10FA and 10FB supported rotational moveably by the carrier housing 2 to be engageable with the step height 20N of the cap body 20 in the pressing cap 14, and helical torsion springs (not shown) for biasing the hook members 10FA and 10FB in the direction that they are engaged with the step height 20N of the cap body 20.

Accordingly, when the pressing cap 14 is located over the bare chip 12 positioned in advance relative to the bumps 6B of the contact sheet 6, as shown in FIG. 21, the tip ends of the hook members 10FA and 10FB of the latch mechanism 10 are made to rotate by the edge of the step height of the cap body 20 of the pressing cap 14 to be away from each other so that the pressing body 16 of the pressing cap 14 is accommodated in the accommodation portion 2A.

When the pressing cap 14 is mounted to the interior of the accommodation portion 2A in the carrier housing 2, the outer periphery of the pressing body 20 is guided by a guiding member 8 provided in the carrier housing 2. Thereafter, by being biased by the helical torsion spring, tip ends of the hook members 10FA and 10FB of the latch mechanism 10 is made to rotate in the mutually approaching direction as shown in FIG. 20 and engaged with the upper surfaces of the step height 20N of the cap body 20. As a result, the pressing cap 14 is held by the carrier housing 2.

Since the respective bump 6B as described above is formed with diameter-to-height ratios of 1:1, if the diameter becomes smaller in correspondence to the high-density arrangement of the electrode group in the bare chip 12, the height of the bump 6B is also lower.

Accordingly, when a region in the vicinity of the bump group opposed to the elastic sheet 4 in the contact sheet 6 sinks against the elasticity of the elastic sheet 4 as shown in FIG. 22 in an partially enlarged manner, there is a risk in that the outer peripheral edge of the bare chip 12 is brought into contact with a copper conductor layer 6C formed on the surface of the contact sheet 6 and may be damaged thereby, as shown in FIG. 21. Also, there is a risk in that a contact pressure of the bump group of the contact sheet 6 with the electrode group of the bare chip 12 is lower than a predetermined value.

FIG. 23 illustrates another example of the conventional carrier unit. The carrier unit shown in FIG. 23 is comprised of a carrier housing 2' having an accommodation portion 2A' for accommodating a bare chip 12', a contact sheet 6' disposed on the inner bottom of the accommodation portion 2A' of the carrier housing 2' via an elastic sheet 4', a pressing cap 14' for pressing the electrode group in the bare chip 12' onto the bump group of the contact sheet 6', and a latch mechanism 10' for selectively holding the pressing cap 14' on the carrier housing 2'.

The contact sheet 6' has a plurality of bumps 6b' made of copper or others and opposed to the electrode group in the bare chip 12' to be electrically connected thereto. In this regard, in FIG. 23, of which two bumps 6b' are shown in an exaggerated manner as representative. A tip end of the respective bump 6b' projects from the surface of the contact sheet 6 by a predetermined height.

The pressing cap 14' is comprised of a pressing body 16' having a pressing surface to be brought into contact with a surface of the bare chip 12' opposite to the surface of the bare chip 12' on which the electrode group are formed, a cap body 20' for accommodating a base portion of the pressing body 16' and a plurality of springs 18' disposed in a space between the base portion of the pressing body 16' and the inside surface of the cap body 20', for biasing the pressing body 16' toward the bare chip 12'.

The base portion of the pressing body 16' is inserted into a recess of the cap body 20' in a movable manner, and has hooks on the outer periphery thereof.

The cap body 20' has projections at opposite ends thereof to be engaged with hook members 10' of the latch mechanism.

The latch mechanism includes hook members 10' supported rotational moveably by the carrier housing 2' to be engageable with the projections of the cap body 20' in the pressing cap 14', and helical torsion springs for biasing the hook members 10' in the direction that they engage with the projections of the cap body 20'.

Accordingly, when the pressing cap 14' is located over the bare chip 12' positioned in advance relative to the bumps 6b' in the contact sheet 6', tip ends of the hook members 10' of the latch mechanism are made to rotate by the slanted surface of the projection of the cap body 20' in the pressing cap 14' in the mutually parting direction, whereby the pressing body 16' of the pressing cap 14' is accommodated. When the pressing cap 14' is mounted into the accommodation portion 2A' of the carrier housing 2', the outer periphery of the cap body 20' is guided by guide members 8' provided at the carrier housing 2'. Thereafter, by the biasing force of the helical torsion springs, the tip ends of the hook members of the latch mechanism 10' are made to rotate in the mutually approaching direction and engage with the upper surface of the projection of the cap body 20'. As a result, the pressing cap 14' is held by the carrier housing 2'.

The carrier unit, the bumps 6b' in the contact sheet 6' or others are preferably durable against the repeated use of several times. Particularly, by the repeated use, a contact area between the tip end of the bump 6b' in the contact sheet 6'and the electrode of the bare chip 12' will be liable to be gradually larger because the bare chip 12' is pressed at a predetermined pressure.

As described above, the cap body 20' of the pressing cap 14' is mounted to the accommodation portion in the carrier housing 2' while being guided by the guide member 8' provided in the carrier housing 2'. However, since a gap is actually formed between the outer periphery of the carrier housing 2' and the guide member 8', the tip ends of the bumps 6b' are pressed by a deviated pressure generated on the chip 12' by the pressing cap 14' inclined toward one side.

Accordingly, the distribution of heights and contact areas or the like of the plurality of bumps 6' is varied to exceed the allowable value, whereby there is a risk in that the electric connection the tip ends of a portion among the bumps 6b' with the electrodes of the bare chip 12' becomes unreliable.

SUMMARY OF THE INVENTION

In view of the above problems in the prior art, a first object of the present invention is to provide a socket for a semiconductor device comprising a contact sheet, capable of restricting the contact of a bare chip with the contact sheet caused by the sinking of the contact sheet in the vicinity of a bump group accompanied with the high-density arrangement of a electrode group in the bare chip.

A second object of the present invention is to provide a socket for a semiconductor device capable of avoiding the inconvenience in that the undesirable deviated pressure is applied to part of a plurality of bumps in the contact sheet.

In a first aspect of the present invention, there is provided a socket for a semiconductor device comprising: a contact sheet having a plurality of bumps to be electrically connected to a terminal group of a semiconductor device, for inputting/outputting signals relative to the semiconductor device, a pressing member for pressing terminals of the semiconductor device onto the bumps of the contact sheet, an accommodation portion for accommodating the semiconductor device disposed on the contact sheet, and a movement-amount controlling member for controlling a movement amount of the semiconductor device along the direction of a projected height of the bump when the pressing member disposed in the accommodation portion is in a pressed state.

In a second aspect of the present invention, there is provided a socket for a semiconductor device comprising: a contact sheet having a bump group to be electrically connected to a terminal group of a semiconductor device, for inputting/outputting signals relative to the semiconductor device, a pressing member for pressing terminals of the semiconductor device onto a bump group of the contact sheet, and a contact sheet pressing member for pressing the contact sheet in the direction in which the sinking of the contact sheet in the vicinity of the bump group is restricted when the terminals of the semiconductor device are pressed onto the bump group by the pressing member.

In a third aspect of the present invention, there is provided a socket for a semiconductor device comprising: a contact sheet having a plurality of bumps to be electrically connected to a terminal group of a semiconductor device, for inputting/outputting signals relative to the semiconductor device, a pressing member for pressing terminals of the semiconductor device onto the bumps of the contact sheet, an accommodation portion for accommodating the semiconductor device disposed on the contact sheet, and a movement-amount restricting member for restricting a movement amount of the semiconductor device along the direction of a projected height of the bump when the pressing member disposed in the accommodation portion is in a pressed state.

As apparent from the above description, according to the socket for a semiconductor device according to the present invention, since the contact sheet pressing member is provided for pressing the contact sheet in the direction for suppressing the sinking of an area on the periphery of the bump group in the contact sheet when the terminals of the semiconductor device are pressed onto the bump group, it is possible to restrict the contact of the bare chip with the contact sheet due to the sinking of the area in the contact sheet in the vicinity of the bump group accompanied with the high-density arrangement of the terminal group in the bare chip.

Also, according to the socket for a semiconductor device according to the present invention, since an amount of the movement of the semiconductor device in the height direction of the bump is restricted when the pressing member disposed in the accommodation portion is in a pressed state, it is possible to avoid the application of the undesirable deviated pressure to part of the plurality of bumps in the contact sheet.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 6:
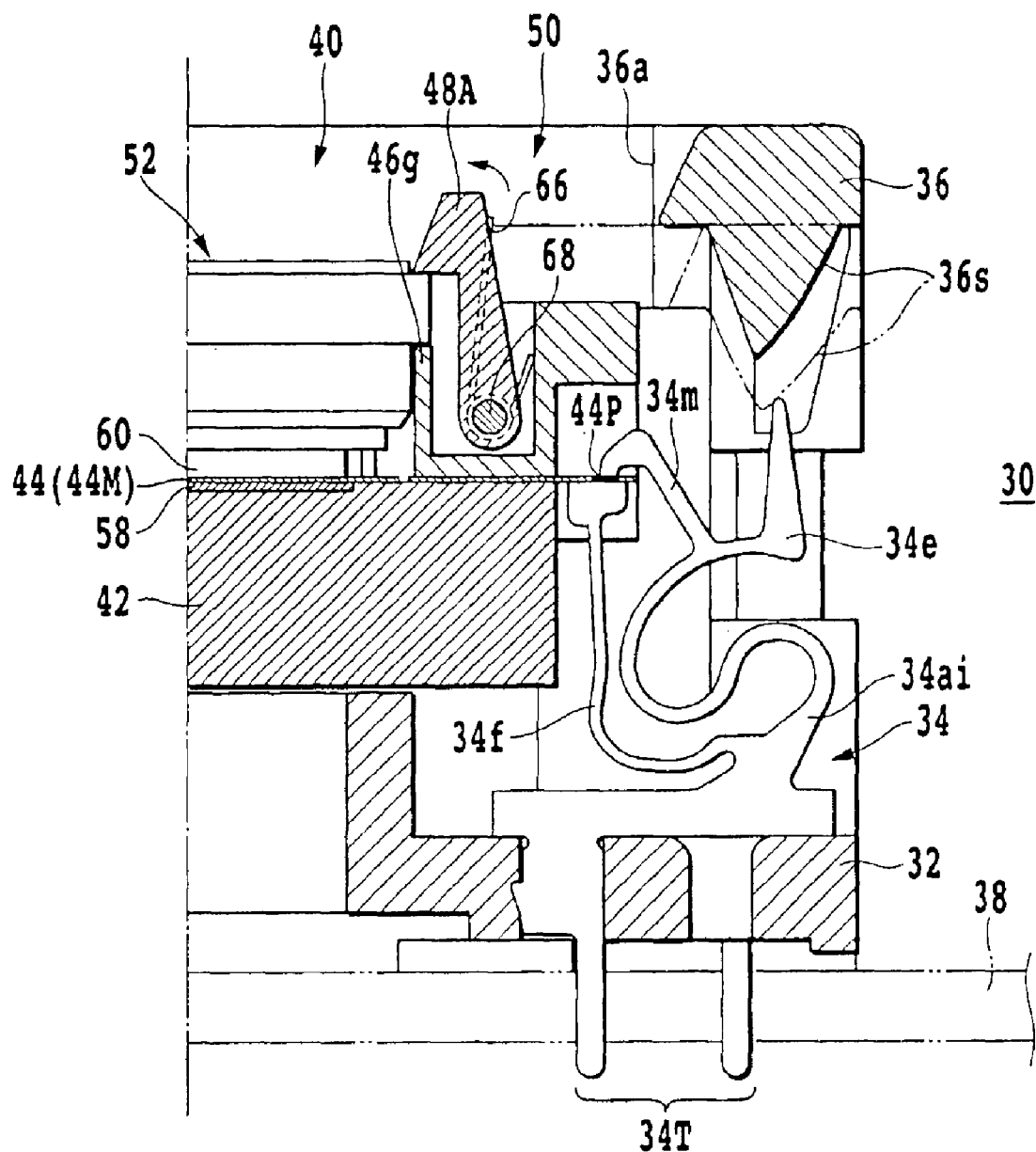
FIG. 6 is a structural drawing schematically showing an overall structure in the embodiment of the socket for a semiconductor device according to the present invention.

FIG. 6 illustrates one embodiment of the socket for a semiconductor device according to the present invention.

In the socket for a semiconductor device shown in FIG. 6 is comprised of a carrier unit 40 for accommodating a bare chip 60 therein as a semiconductor device, and an IC socket 30 to which is detachably mounted the carrier unit 40.

The IC socket 30 is mainly comprised of a body section 32 disposed on a printed wiring board 38 for inputting test signals to the bare chip 60 and outputting detected output signals from the bare chip 60, having an accommodation portion for accommodating the carrier unit 40, a contact group 34 consisting of a plurality of contacts to be electrically connected to pads, respectively, on a contact sheet 44 described later, and a cover member 36 disposed to be movable upward/downward relative to the body section 32 so that the respective contact sections in the contact group 34 are selectively electrically connected to the respective pads of the contact sheet.

Figure 7:
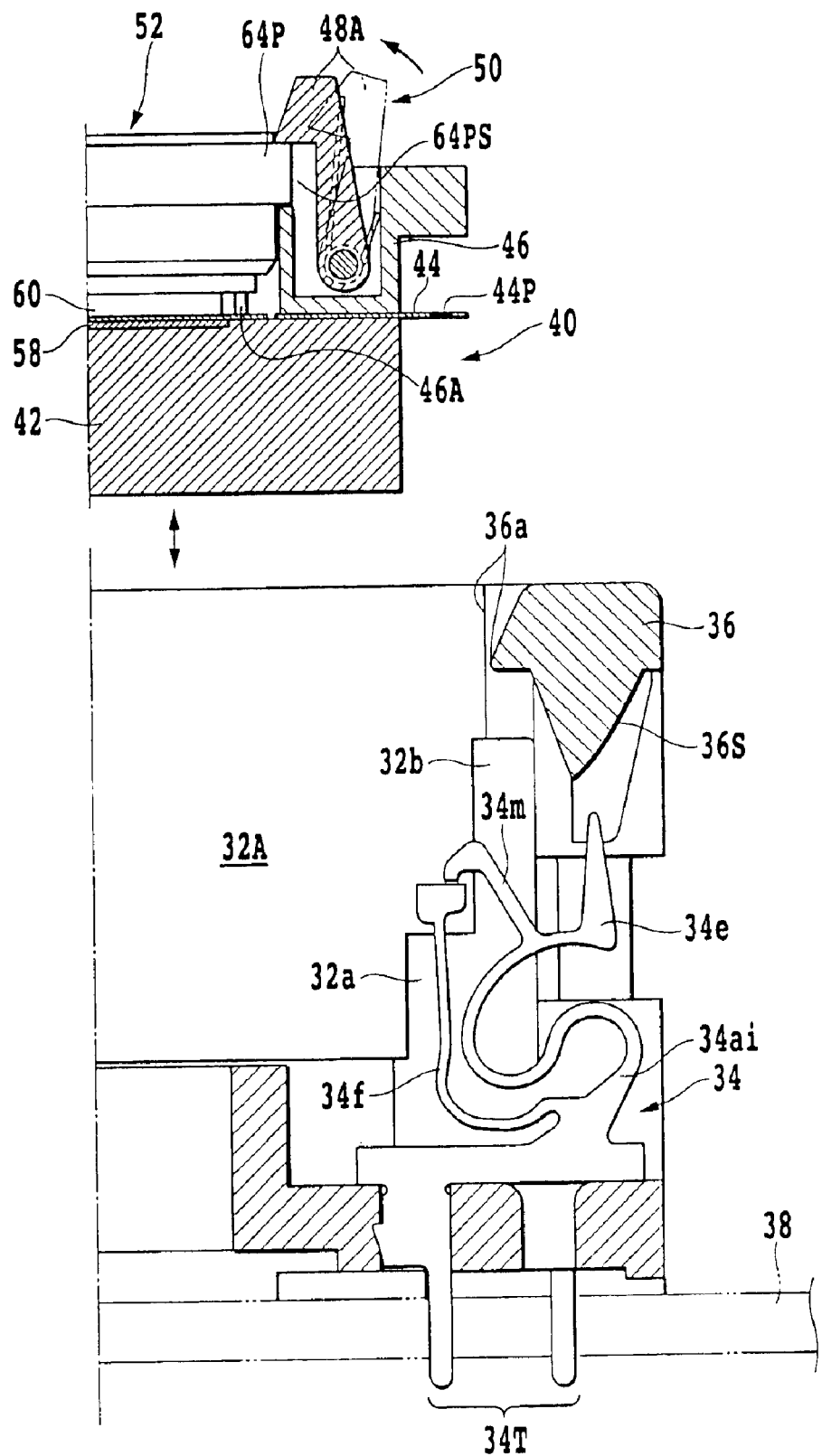
FIG. 7 is an exploded structural drawing schematically showing an overall structure in the embodiment shown in FIG. 6.

The body section 32 molded of resinous material is disposed at a predetermined position in correspondence to the electrode portion of the printed wiring board 38. The body section 32 has an accommodation portion 32A for accommodating the carrier unit 40 therein as shown in FIG. 7. The accommodation portion 32A is surroundedly defined by the inner periphery of a lower base portion 32a to be engaged to a lower portion of a base of the carrier unit 40 described later and the inner periphery of an upper base portion 32b contiguous to the lower base portion 32a to be engaged to an upper portion of the base. The contact group 34 are held by the lower base portion 32a. Slits are formed in the lower base portion 32a and the upper base portion 32b at a predetermined pitch in the vertical direction relative to a paper surface so that the respective contacts 34ai (wherein i=1 to n, n is a positive integer) in the contact group 34 are inserted therein. The contact group 34 are provided on each side while encircling the accommodation portion 32A. In this regard, in FIGS. 6 and 7, only one group among the four contact groups 34 encircling four sides of the accommodation portion 32A are illustrated.

The respective contact 34ai (wherein i=1 to n, n is a positive integer) is comprised of a terminal section 34T press-fit into the lower base portion 32a, a fixed contact section 34f contiguous to the terminal section 34T and electrically connected to a pad 44P of the contact sheet 44 described later from below, an elastic movable contact section 34m contiguous to the terminal section 34T and electrically connected to the pad 44P from above, and a portion being engaged 34e bifurcated from the movable contact section 34m and selectively engageable with a slant of a cover member 36 described later to rotate the movable contact section 34m to be away from the fixed contact section 34f.

The contacts 34ai are arranged at a predetermined pitch in correspondence to the pads 44P of the contact sheet 44 described later in the direction generally vertical to the paper surface, respectively. The cover member 36 molded of resinous material has an opening 36a through which the carrier unit 40 passes. A frame portion defining the periphery of the opening 36a is supported by legs guided by grooves provided on the outer periphery of the body section 32 to be movable upward and downward. In this regard, the cover member 36 is biased by elastic members (not shown) to be away from the body section 32. At a lower end of the respective side of the frame portion, a slant section 36s is formed, respectively. When the cover member 36 is lowered to a predetermined position as shown by a chain double-dashed line in FIG. 6, the slant section 36s is engaged with the portion being engaged 34e of the contact 34ai as above to rotate the movable contact section 34m against the elasticity thereof to be away from the fixed contact section 34f.

When the carrier unit 40 described later is mounted to the body section 32 of the IC socket 30, the cover member 36 is pushed down by a given distance and maintained there so that the respective movable contact sections 34m in the contact group 34 are moved to a waiting position away from the accommodation portion 32A, then the carrier unit 40 is inserted and positioned in the accommodation portion 32A from above through the opening 36a. At this time, the fixed contact section 34f is brought into contact with the lower surface of the pad 44P of the contact sheet 44 in the carrier unit 40.

Subsequently, when the cover member 36 is released from the retention state, the cover member 36 is moved upwardly due to a resultant force of the above recovery force of the elastic body and the elastic force of the portion being engaged 34e of each contact 34ai. At this time, the respective movable contact section 34m in the contact group 34 returns to the original position and is brought into contact with the upper surface of the pad 44P of the contact sheet 44 in the carrier unit 40. Thereby, as shown in FIG. 6, the contact sheet 44 is electrically connected to the four contact groups 34.

As shown in FIG. 7, the carrier unit 40 in the first embodiment is comprised of a carrier housing 46 having an accommodation portion 46A for accommodating the bare chip 60, the contact sheet 44 disposed on the base member 42 defining a bottom of the accommodation portion 46A of the carrier housing 46 via an elastic sheet 58 made of the rubber material, a pressing cap 52 including a pressing body for pressing the electrode group of the bare chip 60 onto the bump group 44B of the contact sheet 44, and a latch mechanism 50 for selectively holding the pressing cap 52 on the carrier housing 46.

The latch mechanism 50 is comprised of hook members 48A and 48B supported rotational moveably at opposite ends of the carrier housing 46, for holding a cap body of the pressing cap 52, helical torsion springs 66 for biasing the hook members 48A and 48B in the direction shown by an arrow in FIG. 7, that is, in the direction that engages them with projections of the cap body, and pins 68 for supporting the hook members 48A and 48B and the helical torsion springs 66.

At each of the opposite ends of the carrier housing 46, a guide section 46g is formed for guiding an outer periphery of a lower portion of the cap body 64 when the pressing cap 52 is mounted. On the periphery of the guide section 46g, opposite ends of the pin 68 is supported.

Figure 1:
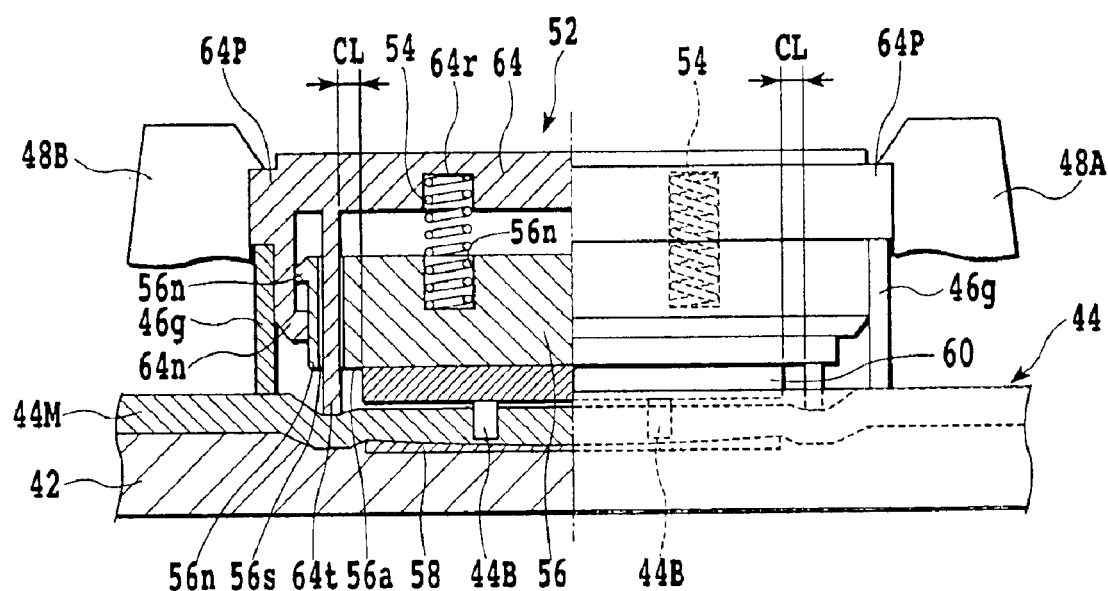
FIG. 1 is a structural drawing showing a configuration in a first embodiment of a carrier unit used in an example of a socket for a semiconductor device according to the present invention.

The contact sheet 44 has a plurality of bumps 44B in a substrate 44 arranged in correspondence to the electrode group of the bare chip 60 to be electrically connected thereto, as schematically illustrated in an partially enlarged manner in FIG. 1. In this regard, in FIG. 1, two in the plurality of bumps 44B are shown in an exaggerated manner as representatives. For example, the bump 44B made of copper or others has a diameter of approximately 100 $\mu$m at a root thereof and projects from the surface of the substrate 44M by a predetermined height, for example, of approximately 50 $\mu$m. The substrate 44M is made, for example, of polyimide resin as thin as about several tens $\mu$m.

The respective bump 44B is connected to the respective pad 44p via a conductor layer 44c made of copper foil. As shown in FIG. 6, the plurality of pads 44p are formed in opposite end portions of the substrate 44M extended outward from the opposite ends of the base member 42.

Figure 2:
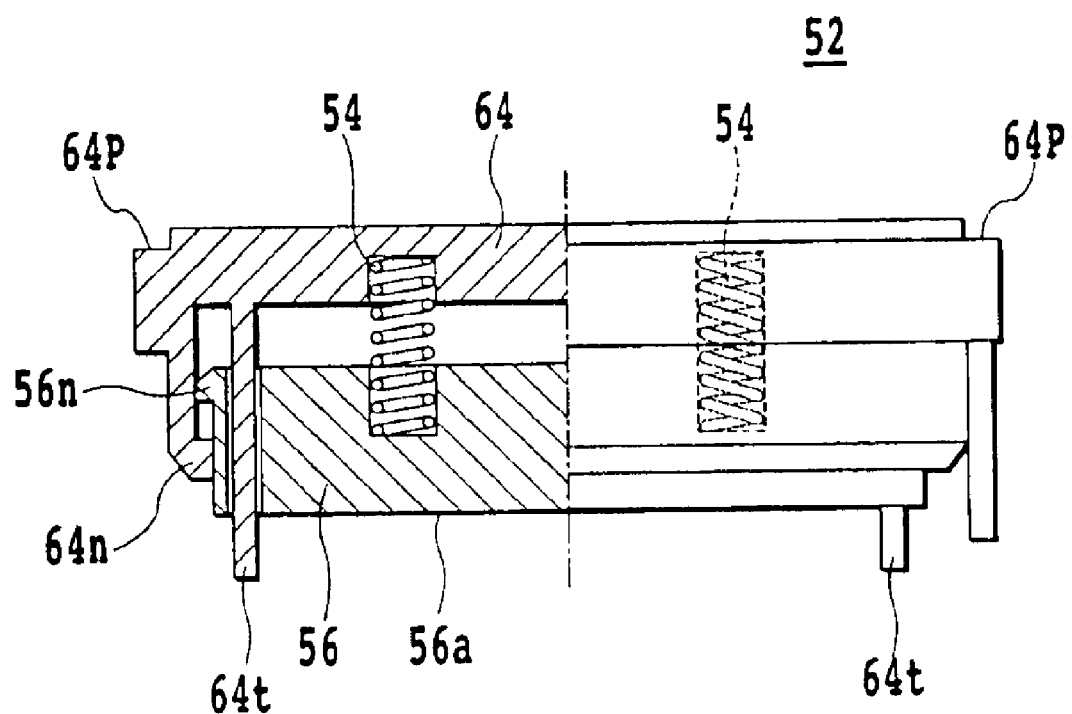
FIG. 2 is a structural drawing showing a configuration of a pressing cap in the carrier unit shown in FIG. 1.
Figure 3:
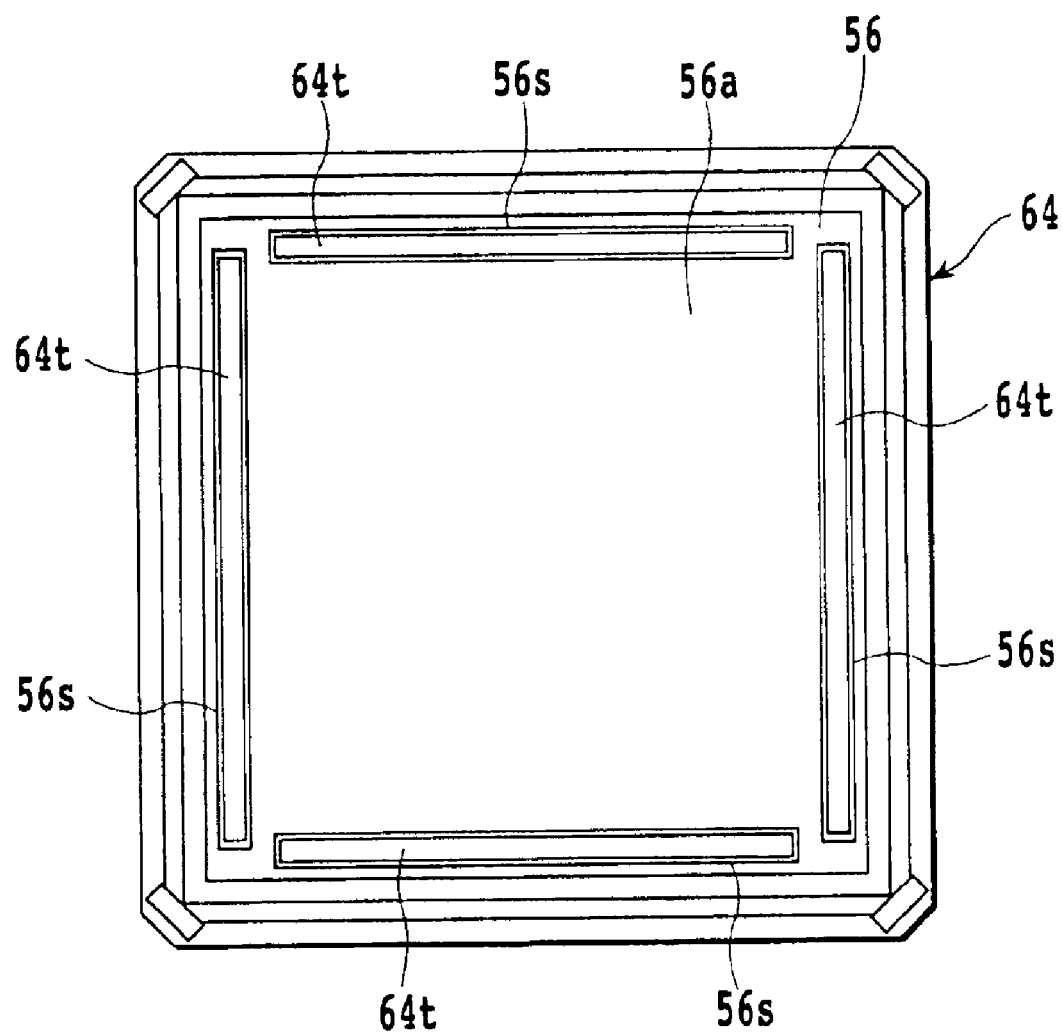
FIG. 3 is a plan view of the embodiment shown in FIG. 2.

The pressing cap 52 is comprised of, as shown in FIGS. 1 and 2, a pressing body 56 having a pressing surface 56a to be brought into contact with the upper surface of the bare chip 60, a cap body 64 for accommodating a base portion of the pressing body 56, and a plurality of springs 54 disposed in a space between recesses 56r in the base portion of the pressing body 56 and recesses 64r in the cap body 64, for biasing the pressing body 56 toward the bare chip 60. In this regard, FIG. 2 illustrates the pressing cap 52 in a pressed state.

The bare chip 60 of a generally square shape has the electrode group on the lower surface opposed to the bumps in the contact sheet 44.

The cap body 64 has projections 64p on the outer periphery thereof, as shown in FIG. 1, to be engaged with the hook members 48A and 48B, respectively, in the latch mechanism 50.

Figure 4:
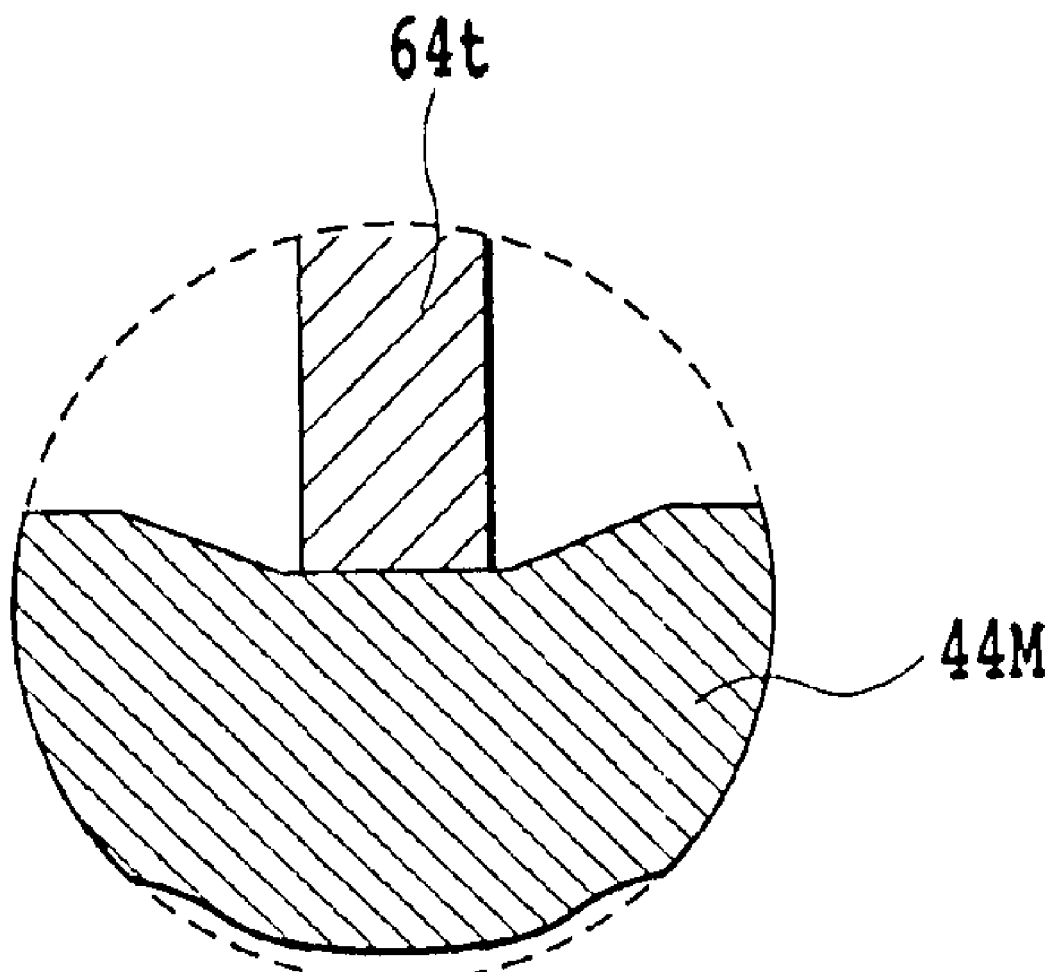
FIG. 4 is an enlarged partially sectional view of an important part of the embodiment shown in FIG. 1.
Figure 5:
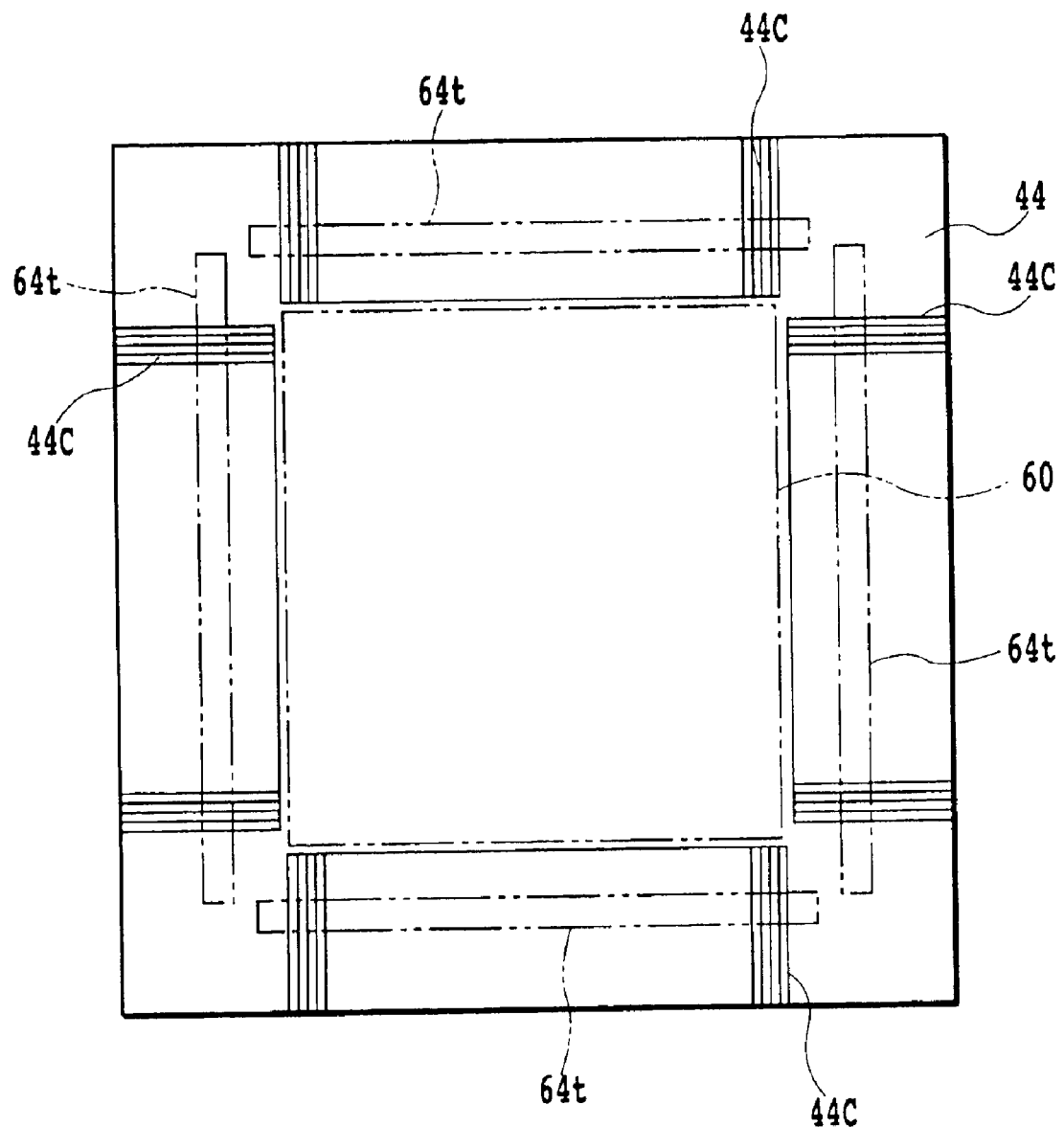
FIG. 5 is a plan view of a contact sheet in the embodiment shown in FIG. 1.

In a recess of the cap body 64, to which the recesses 64r open, lamellar pieces 64t are formed integral with the cap body 64 at a plurality positions as contact sheet pressing members. The lamellar piece 64t having a predetermined thickness is provided, for example, at four positions in correspondence to the respective sides of the bare chip 60 to intersect the base portion of the pressing body 56 in the generally vertical direction thereto as shown in FIG. 5. The respective lamellar piece 64t is provided to define a predetermined gap CL between the same and the end of the respective side of the bare chip 60, for example, in a range from approximately 0.1 mm to 1 mm. Also, a projected length of the lamellar piece 64t is determined such that the surface of the substrate 44M of the contact sheet 44 sinks to a depth corresponding to the height of the bump 44B as shown in FIG. 4 in an enlarge manner when the lamellar piece 64t passes through the slit 56s in the base portion of the pressing body 56 and presses the substrate 44M of the contact sheet 44 as shown in FIG. 1.

The base portion of the pressing body 56 is inserted in the recess in the cap body 64 in a movable manner. At an end of a portion of the pressing body 56 inserted into the recess, a plurality of hooks 56n engageable with hooks 64n provided at a lower end of the cap body 64 are formed. Thereby, the pressing body 56 is held in the interior of the cap body 64 while being biased with the springs 54, for example.

In such a structure, when the bare chip 60 is mounted into the carrier unit 40, the electrode group of the bare chip 60 are first positioned to the bumps 44B in the contact sheet 44 so that the electrode group of the bare chip 60 are brought into contact with the bumps 44B.

Then, the pressing cap 52 is inserted into the accommodation portion 46A of the carrier housing 46. At this time, tip ends of the hook members 48A and 48B of the latch mechanism 50 are made to rotate in the direction away from each other against the biasing force of the helical torsion springs 66. Also, the pressing surface 56a of the pressing body 56 is pressed onto the upper surface of the bare chip 60 against the biasing force of the springs 54, while the outer peripheral surface of the cap body 64 is guided by the inner surface of the guide section 46g.

At this time, as shown in FIGS. 1 and 4, the portion close to an end portion of the respective side of the bare chip 60 on the substrate 44M of the contact sheet 44 is pressed by one end of the lamellar piece 64, and sinks. Accordingly, it is possible to avoid the interference between the conductor layer 44c formed on the surface of the substrate 44M in the contact sheet 44 and the end portion of the bare chip 60.

Subsequently, due to the biasing force of the helical torsion springs 66, the tip ends of the hook members 48 are made rotate in the mutually approaching direction and engaged with the projections 64p of the cap body 64. As a result, as shown in FIG. 1, the pressing cap 52 is held by the carrier housing 46.

Figure 8:
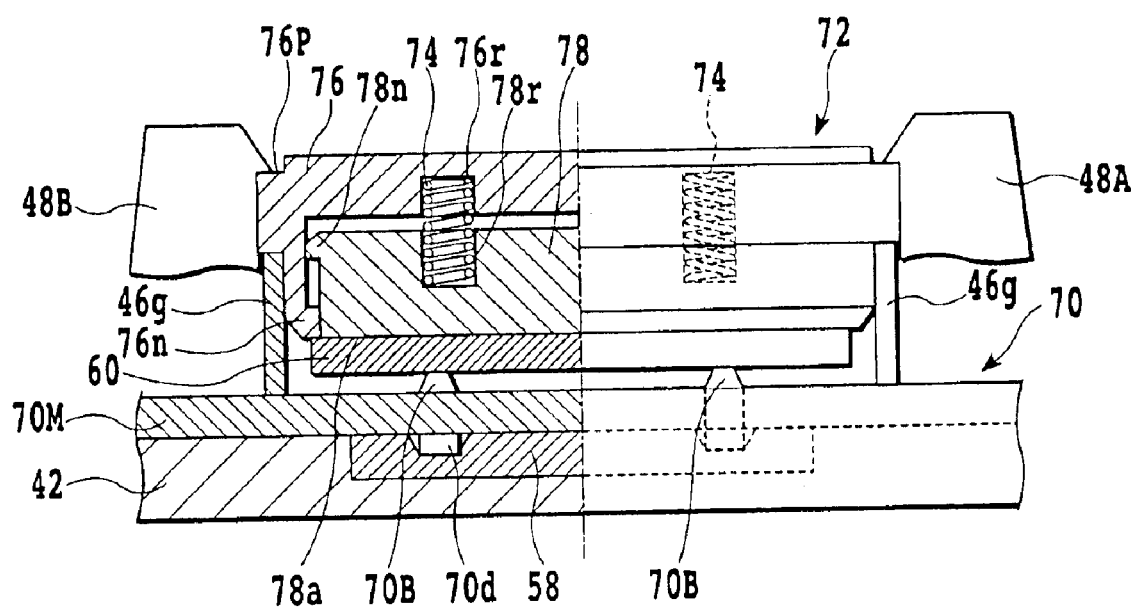
FIG. 8 is a structural drawing showing a configuration in a second embodiment of a carrier unit used for the socket for a semiconductor device according to the present invention.

FIG. 8 illustrates a second embodiment of a carrier unit used for the socket for a semiconductor device according to the present invention. In FIG. 8, the same reference numerals are used for denoting the same constituent elements in the embodiment shown in FIG. 1 and the explanation thereof will be eliminated.

The carrier unit shown in FIG. 8 is comprised of a carrier housing 46 having an accommodation portion 46A for accommodating a bare chip 60 as shown in FIG. 1, a contact sheet 70 disposed on a base member 42 defining a bottom of the accommodation portion 46A in the carrier housing 46 via an elastic sheet 58, a pressing cap 72 including a pressing body for pressing an electrode group in the bare chip 60 onto a bump group 70B in the contact sheet 70, and a latch mechanism 50 for selectively holding the pressing cap 72 in the carrier housing 46.

Figure 9:
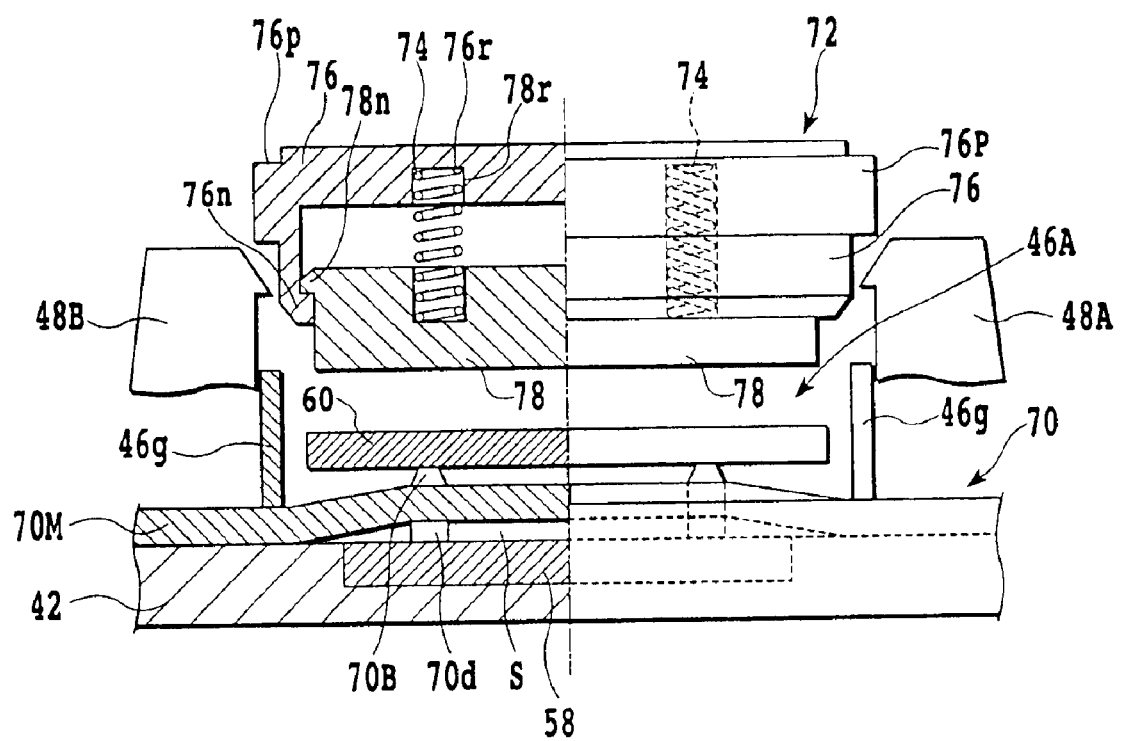
FIG. 9 is a structural drawing made available for explaining the operation of the embodiment shown in FIG. 8.

As shown in FIG. 9, the contact sheet 70 has a plurality of bumps 70B disposed in a substrate 70M in correspondence with the arrangement of the electrode group in the bare chip 60 to be electrically connected thereto. In FIG. 9, two in the plurality of bumps 70B are shown as representatives in the exaggerated manner. The bump 70B made, for example, of copper has a diameter in a root portion of approximately 100 $\mu$m, and is projected from the surface of the substrate 70M at a predetermined height, for example, of approximately 50 $\mu$m. The substrate 70M is made, for example, of polyimide resin to be a sheet of approximately several tens $\mu$m thick.

The respective bump 70B is connected to the respective pad (not shown) via a conductor layer made of copper. A plurality of pads are formed in opposite end portions of the substrate 70M extended outward from the opposite ends of the base member 42.

Figure 10:
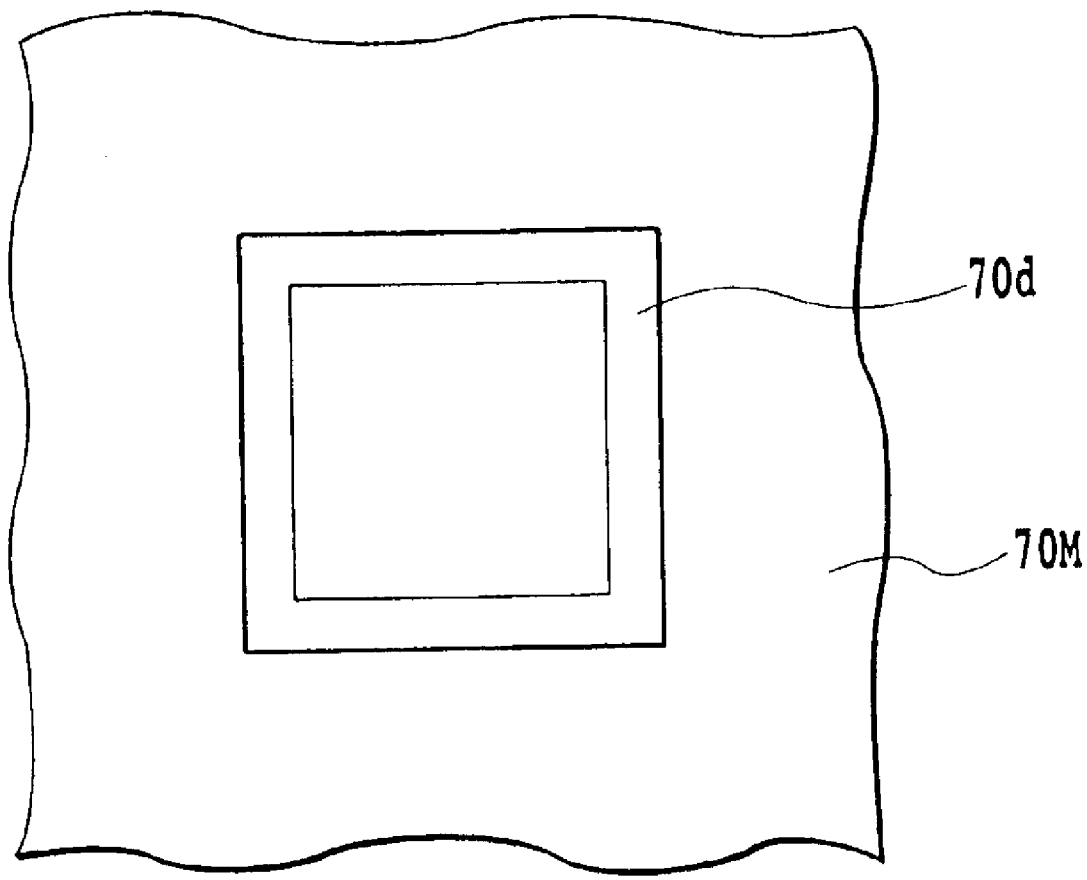
FIG. 10 is a plan view of a contact sheet in the embodiment shown in FIG. 8.

As shown in FIG. 10, a frame-shaped convex seat 70d having a predetermined width is provided in an area of a surface of the substrate 70M opposed to the elastic sheet 58 corresponding to the arrangement of the bumps 70B, as a sinking-adjustment area for adjusting an amount of sinking of the respective bump 70B. The seat 70d is made, for example, of resin, metal or resist to have a predetermined height. As shown in FIG. 9, a height thereof is determined so that a predetermined gap S is formed between the surface of the contact sheet 70 and that of the elastic sheet 50 when no pressure is applied; that is, the height is, for example, in a range from 5 to 200 $\mu$m in accordance with the amounts of sinking of the respective bumps 70B.

As shown in FIG. 8, the pressing cap 72 is constituted by a pressing body 78 having a pressing surface 78a to be brought into contact with the upper surface of the bare chip 60, a cap body 76 for accommodating a base portion of the pressing body 78, and a plurality of springs 74 arranged in a space between recesses 78r in the base portion of the pressing body 78 and recesses 76r in the cap body 76, for biasing the pressing body 78 toward the bare chip 60. In this regard, the pressing cap 72 is in a pressed state in FIG. 8.

The cap body 76 has projections 76p on the outer periphery thereof to be engaged with hook members 48A and 48B, respectively as shown in FIG. 8.

A base portion of the pressing body 78 is inserted in a movable manner into a recess of the cap body 76 to which the recesses 76r open. At an end of a portion of the pressing body 78 inserted into the recess, a plurality of hooks 78n are formed opposite to hooks 76n provided at a lower end of the cap body 76 so that both of them are engaged with each other. Thereby, the pressing body 78 is held in the interior of the cap body 76 while being biased by the springs 74.

In such a structure, when the bare chip 60 is mounted to the carrier unit, first, the electrode group in the bare chip 60 are positioned to the bumps 70B in the contact sheet 70 so that the electrode group in the bare chip 60 are brought into contact with the bumps 70B as shown in FIG. 9.

Then, the pressing cap 72 is inserted into the accommodation portion 46A in the carrier housing 46. At this time, tip ends of the hook members 48A and 48B in the latch mechanism 50 are made to rotate to be away from each other against the bias of the helical torsion springs. Also, the pressing surface 78a of the pressing body 78 is pressed onto the upper surface of the bare chip 60 against the biasing force of the springs 74, while the outer peripheral surface of the cap body 76 is guided by the inner surface of the guide sections 46g.

At this time, the gap S formed between the surface of the contact sheet 70 and that of the elastic sheet 58 is eliminated and the amount of sinking of the substrate 70M in the contact sheet 70 in the vicinity of the bump 70B is restricted not to exceed the predetermined value, whereby the interference is avoidable between the conductor layer of the substrate 70M and the end portion of the bare chip 60.

Subsequently, the tip ends of the hook members 48A and 48B are made to rotate in the mutually approaching direction due to the biasing force of the helical torsion springs and engaged with the projections 76p in the cap body 76. As a result, as shown in FIG. 8, the pressing cap 72 is held in the carrier housing 46.

Figure 11:
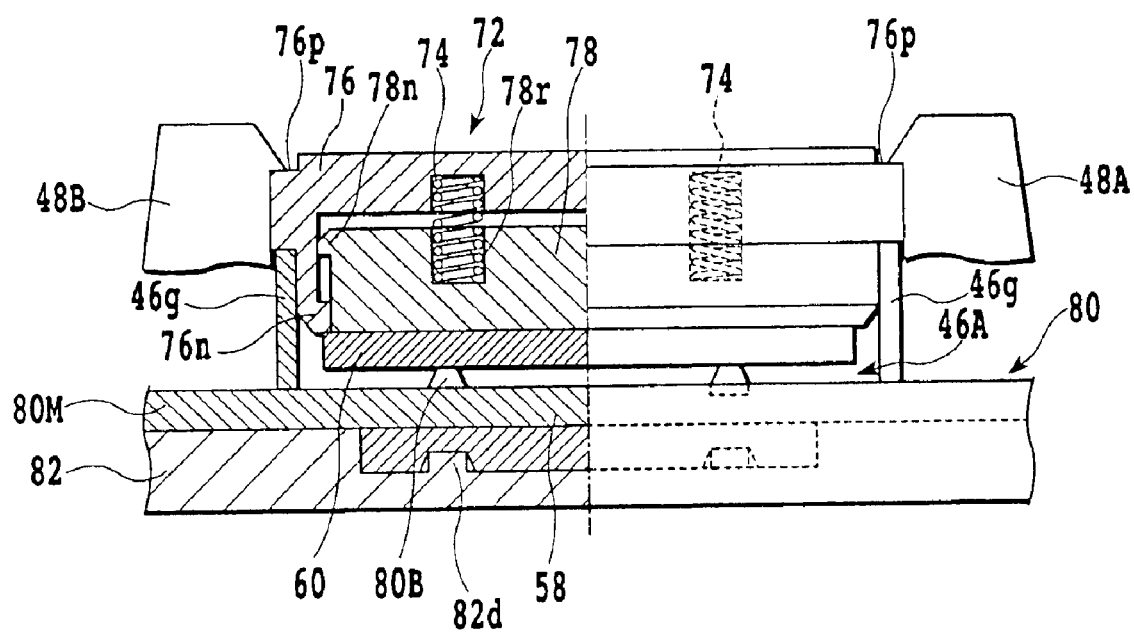
FIG. 11 is a structural drawing showing a configuration in a third embodiment of a carrier unit used for the socket for a semiconductor device according to the present invention.

FIG. 11 illustrates a third embodiment of a carrier unit used for the socket for a semiconductor device according to the present invention. In FIG. 11, the same reference numerals are used for denoting the same constituent elements in the embodiment shown in FIG. 8 and the explanation thereof will be eliminated.

The carrier unit shown in FIG. 11 is constituted by a carrier housing 46 having an accommodation portion 46A for accommodating a bare chip 60 as shown in FIG. 8, a contact sheet 78 disposed on a base member 82 defining a bottom of the accommodation portion 46A in the carrier housing 46 via an elastic sheet 58, a pressing cap 72 including a pressing body for pressing an electrode group in the bare chip 60 onto a bump group 80B in the contact sheet 70, and a latch mechanism 50 for selectively holding the pressing cap 72 in the carrier housing 46.

As shown in FIG. 11, the contact sheet 80 has a plurality of bumps 80B disposed in a substrate 80M in correspondence with the arrangement of the electrode group in the bare chip 60 to be electrically connected thereto. In FIG. 9, two in the plurality of bumps 80B are shown as representatives in the exaggerated manner. The bump 80B made, for example, of copper has a diameter in a root portion of approximately 100 $\mu$m, and is projected from the surface of the substrate 80M at a predetermined height, for example, of approximately 50 $\mu$m. The substrate 80M is made, for example, of polyimide resin to be a sheet of approximately several tens $\mu$m thick.

The respective bump 80B is connected to the respective pad (not shown) via a conductor layer made of copper. A plurality of pads are formed in opposite end portions of the substrate 80M extended outward from the opposite ends of the base member 82.

Figure 12:
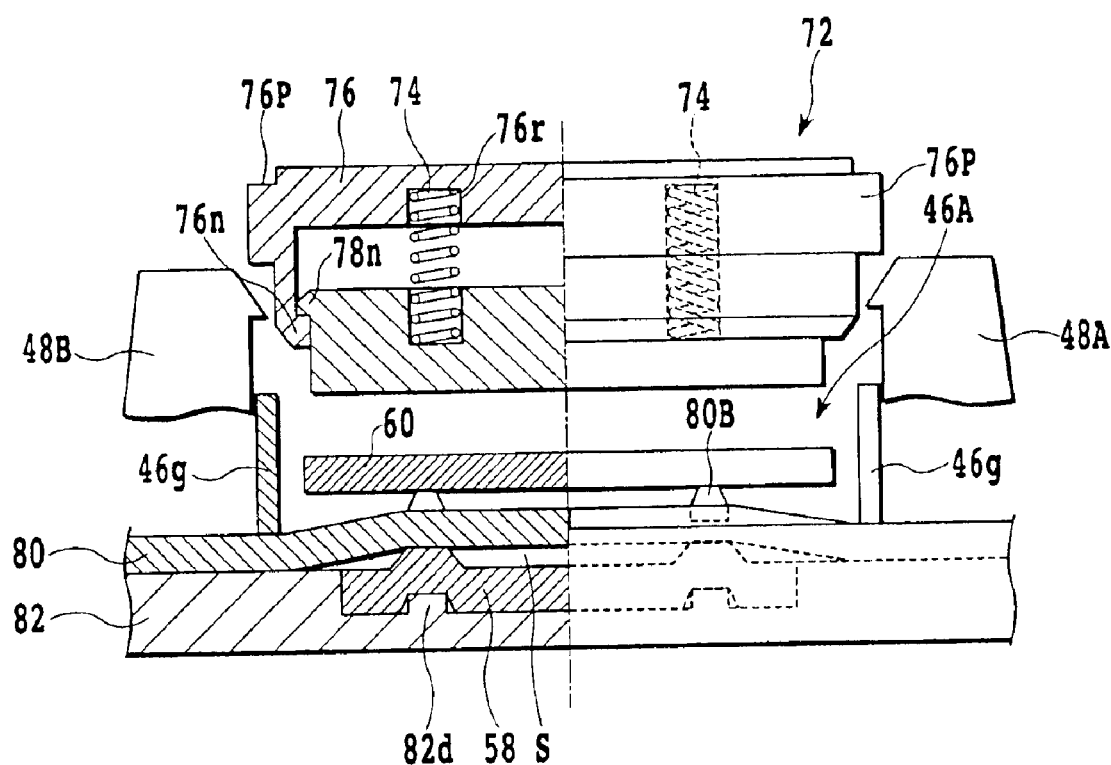
FIG. 12 is a structural drawing made available for explaining the operation of the embodiment shown in FIG. 11.
Figure 13:
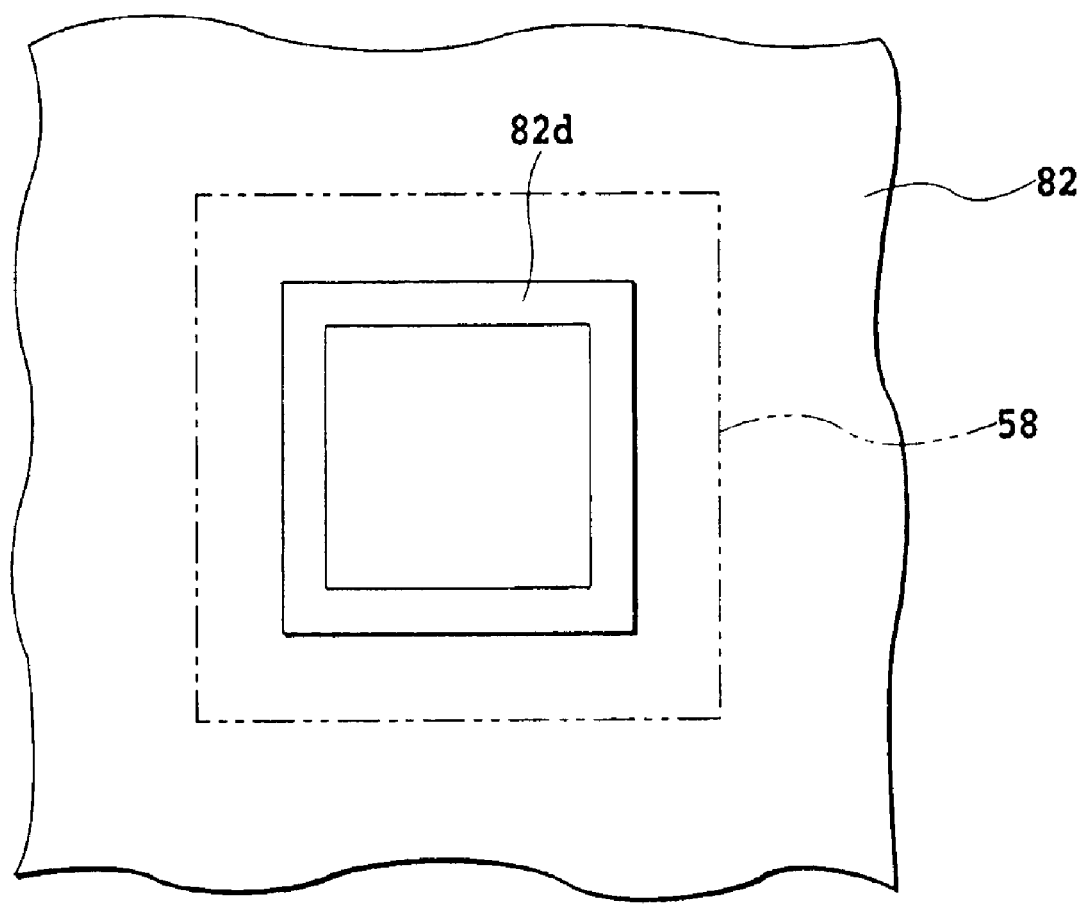
FIG. 13 is a plan view of a base member in the embodiment shown in FIG. 11.

As shown in FIG. 12, in a portion of the base member 82 in which the elastic sheet 58 is disposed and corresponding to the arrangement of the bumps 80B in the substrate 80M, a convex seat 82d in a frame shape having a predetermined width is formed as a sinking-adjustment section for adjusting an amount of sinking of the respective bump 80B. The seat 82d is made, for example, of the same material as that of the base member 82. The height thereof is determined such that when no pressure is applied, a predetermined gap S is formed between the surface of the contact sheet 80 and the surface of the elastic sheet 58, in a range from 5 to 200 μm in accordance with the amount of sinking of the respective bump 80B. In this regard, the seat 82d may be formed separately from the base member 82.

In the above structure, when the bare chip 60 is mounted to the carrier unit, first, the electrode group in the bare chip 60 are positioned in correspondence to the bumps 80B in the contact sheet 80, as shown in FIG. 12, so that the electrode group in the bare chip 60 are brought into contact with the bumps 80B, respectively.

Next, the pressing cap 72 is inserted into the accommodation portion 46A of the carrier housing 46. At this time, tip ends of the hook members 48A and 48B in the latch mechanism 50 are made to rotate to be away from each other against the biasing force of the helical torsion springs. Also, while the outer peripheral surface of the cap body 76 is guided by the inner surfaces of the guide sections 46g, the pressing surface 78a of the pressing body 78 is pressed onto the upper surface of the bare chip 60 against the biasing force of the springs 74.

At this time, the predetermined gap S between the surface of the contact sheet 80 and that of the elastic sheet 58 is eliminated and the amount of sinking in the vicinity of the bumps 80B in the substrate 80M of the contact sheet 80 is restricted not to exceed the predetermined value, whereby the interference is avoidable between the conductor layer of the substrate 80M and the end portion of the bare chip 60.

Subsequently, tip ends of the hook members 48A and 48B are made to rotate to be closer to each other and engaged with the projections 76p of the cap body 76, respectively. As a result, the pressing cap 72 is held in the carrier housing 46.

Figure 17:
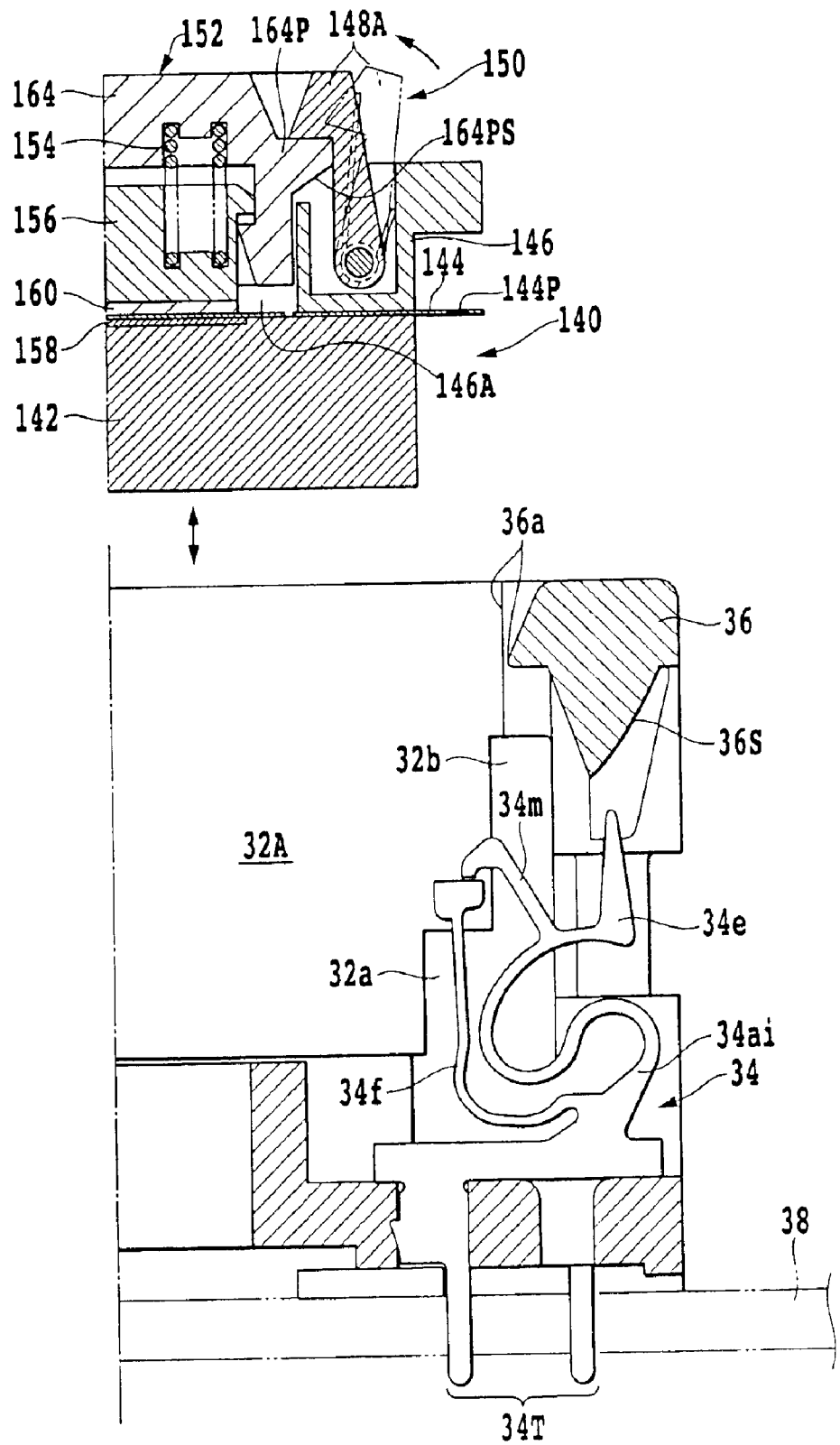
FIG. 17 is a partially sectional view of the carrier unit of the fourth embodiment used for the socket for a semiconductor device according to the present invention, with the carrier unit removed from the body of the IC socket.

FIG. 17 illustrates, together with a socket for a semiconductor device, an important part of a fourth embodiment of a carrier unit used for the socket for a semiconductor device according to the present invention.

In FIG. 17, the same reference numerals are used for denoting the same constituent elements as in the embodiment shown in FIG. 7, and the explanation thereof will be eliminated.

The socket for a semiconductor device shown in FIG. 17 is comprised of a carrier unit 140 for accommodating a bare chip as a semiconductor device in the interior thereof, and an IC socket 30 for mounting the carrier unit 140 in an accommodation portion thereof in a detachable manner.

As shown in FIG. 17, the carrier unit 140 is comprised of a carrier housing 146 having an accommodation portion 146A for accommodating a bare chip 160, a contact sheet 144 disposed on a base member 142 defining the bottom of the accommodation portion 146A in the carrier housing 146 via an elastic sheet 158, a pressing cap 152 including a pressing body 156 for pressing an electrode group of the bare chip 160 onto a bump group 144B in the contact sheet 144, and a latch mechanism 150 for selectively holding the pressing cap 152 in the carrier housing 146.

Figure 14:
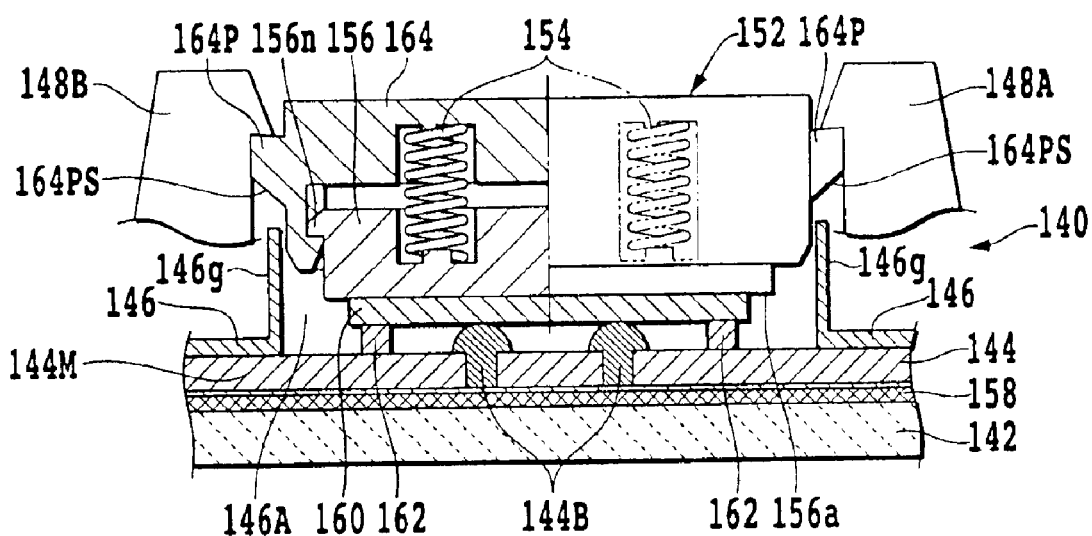
FIG. 14 is a partially sectional view showing an important part in a fourth embodiment of a carrier unit used for the socket for a semiconductor device according to the present invention.

As shown in FIG. 14, the pressing cap 152 is comprised of a pressing body 156 having a pressing surface 156a to be brought into contact with the upper surface of the bare chip 160, a cap body 164 for accommodating a base portion of the pressing body 156, and a plurality of springs 154 arranged in a space between recesses in the base portion of the pressing body 156 and recesses in the cap body 164, respectively, for biasing the pressing body 156 toward the bare chip 160.

The bare chip 160 of a generally square shape has an electrode group, for example, on a lower surface confronting the bumps 144B of the contact sheet 144.

The base portion of the pressing body 156 is inserted into a recess in the cap body 164 in a movable manner. At an end of the inserted portion of the pressing body 156, a plurality of hooks 156n are formed to be engageable with hooks provided at a lower end of the cap body 164, both of which hooks are opposite to each other. Thereby, the pressing body 156 is held in the cap body 164 while being biased by the springs 154.

The cap body 164 is provided at opposite ends thereof with projections 164P to be engaged with the hook members 148A and 148B in the latch mechanism 150. The projection 164P has a slant 164PS engageable with a slant at a tip end portion of the hook member 148A, 148B to push the latter away from each other when the pressing cap 152 is mounted as described later.

The latch mechanism 150 is comprised of the hook members 148A and 148B supported rotational moveably at opposite ends of the carrier housing 146 to hold the cap body 164, helical torsion springs 166 for biasing the hook members 148A and 148B in the direction shown by an arrow in FIG. 17 so that they are engaged with the projections 164p in the cap body 164, and pins 168 for supporting the hook members 148A, 148B and the helical torsion springs 166.

At the opposite ends of the carrier housing 146, the guide sections 146g are formed for guiding the outer periphery of the lower portion of the cap body 164 when the pressing body 152 is mounted.

Opposite ends of the pin 168 are supported by guide sections 146g.

Figure 15:
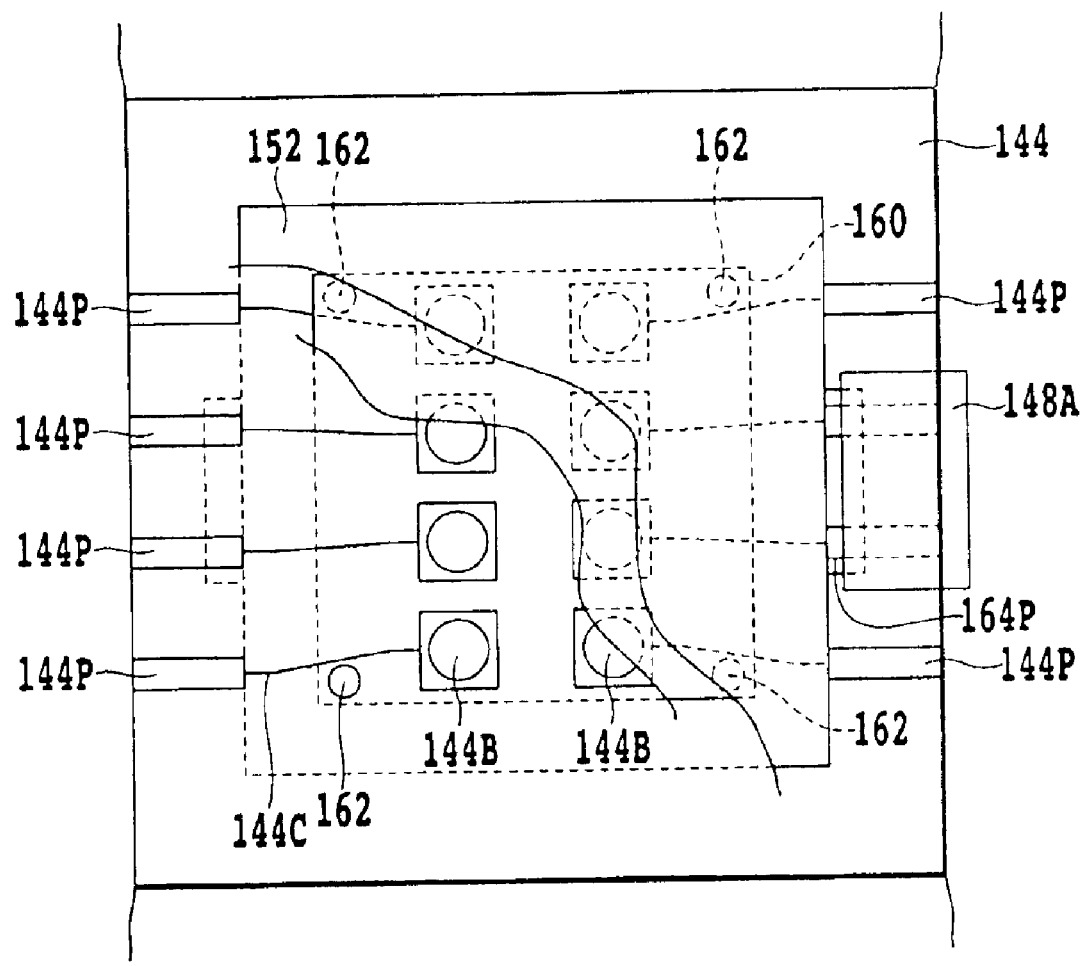
FIG. 15 is a plan view of the embodiment shown in FIG. 14.

As shown in FIGS. 14 and 15, the contact sheet 144 has a plurality of bumps 144B in a substrate 144M, arranged in correspondence to the electrode group of the bare chip 160 to be electrically connected thereto. In FIG. 14, two in the plurality of bumps 144B are shown as representatives in the exaggerated manner. For example, the respective bump 144B made of copper or others has a diameter of approximately 100 μm at a tip end thereof and a predetermined height from the surface of the substrate 144M, for example, of approximately 50 μm. The substrate 144M is made of polyimide resin as thin as approximately several tens μm.

As shown in FIG. 15, the respective bump 144B is connected to the pad 144P via the conductor layer 144C made of copper foil. The pads 144P are formed in the opposite end portions of the substrate 144M extended outward from the opposite ends of the base member 142.

Also, as shown in FIGS. 14 and 15, in portions on the substrate 144M corresponding to four corners of the bare chip 160, dummy bumps 162 are provided, respectively, as a moving amount restriction member. The dummy bump 162 is made, for example, of metal such as palladium (Pd), platinum (Pt), cobalt (Co), iron (Fe), Nickel (Ni), ruthenium (Ru), rhodium (Rh), osmium (Os), iridium (Ir), hassium (Hs), meinerium (Mt) or Unununium (Uun), or alloys mainly composed thereof.

When the dummy bump 162 is formed, as disclosed in Japanese Patent Application Laid-open No. 11-326379

(1999), first, a tip end of a wire made of the above metal is wire-bonded to a pad formed in advance on the substrate 144M by a ultrasonic welding. Then, the bonded tip end portion of the wire is torn. Thereby, a stud bump is formed on the substrate 144M. Finally, the upper end of the stud bump thus formed is flattened with a forming tool to complete the dummy bump 162 on the substrate 144M.

A height of the dummy bump 162 from the surface is determined to be equal to or slightly lower than the height of the bump 144B from the surface, for example.

In this regard, a region in which the dummy bump 162 is positioned is not limited to that shown in this embodiment, but may be a region having no pads or wires, or that in which pads or wire meshes are coated with an insulation coating. Also, material and the number of dummy bumps 162 are not limited to those shown in this embodiment, but other suitable material may be selected, of course, such as solder used for the bumps 144B, having no risk of being crushed while exceeding a predetermined value even if each dummy bumps are subjected to a total load applied to all the bumps 144B with the assumption that a load is applied to the bumps 144B under a pressure of about 10 g per a bump. In this structure, when the bare chip 160 is mounted into the carrier unit 140, the electrode group in the bare chip 160 are positioned to the bumps 144B in the contact sheet 144 so that the electrode group in the bare chip 160 are brought into contact with the bumps 144B, respectively. Then, the pressing cap 152 is inserted into the accommodation portion 146A of the carrier housing 146. At this time, by the slants 164ps of the cap body 164 in the pressing cap 152, tip ends of the hook members 148A and 148B are made to rotate to be away from each other against the bias of the helical torsion springs 166. Also, while the outer peripheral surface of the cap body 156 is guided by the inner surface of the guide sections 146g, the pressing surface 156a of the pressing body 156 is pressed onto the upper surface of the bare chip 160 against the bias of the springs 154.

Subsequently, the tip ends of the hook members 148 are made to rotate to be closer to each other due to the bias of the helical torsion springs 166, and engaged with the projections 164p of the cap body 164. As a result, the pressing cap 152 is held by the carrier housing 146.

Figure 16:
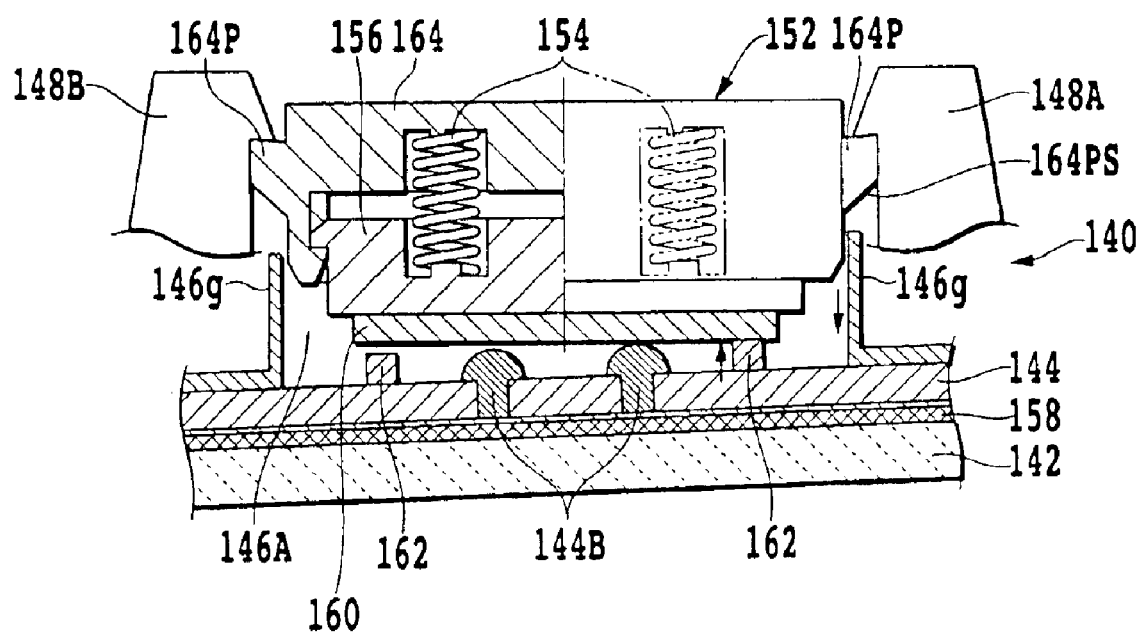
FIG. 16 is a partially sectional view made available for explaining the operation of the embodiment shown in FIG. 14.

At this time, since a predetermined gap actually exists between the outer peripheral surface of the cap body 164 and the inner surface of the guide section 146g, there is a risk in that the pressing surface 156a of the pressing body 156 presses the bare chip 160 and the bumps 144B in an inclined posture as shown in FIG. 16.

However, in such a case, since the dummy bump 162 is provided in the vicinity of the bump 144B, part of the bare chip 160 may interfere with the tip end of the bump 144B to restrict a mount of pressing such as for example a movement distance of the bare chip 160 in the height direction of the bump 144B or a contact area of the tip end of the bump 144B with the electrode surface of the bare chip 160. As a result, the deviated crush of the plurality of bumps 144B is avoidable.

Figure 18A:
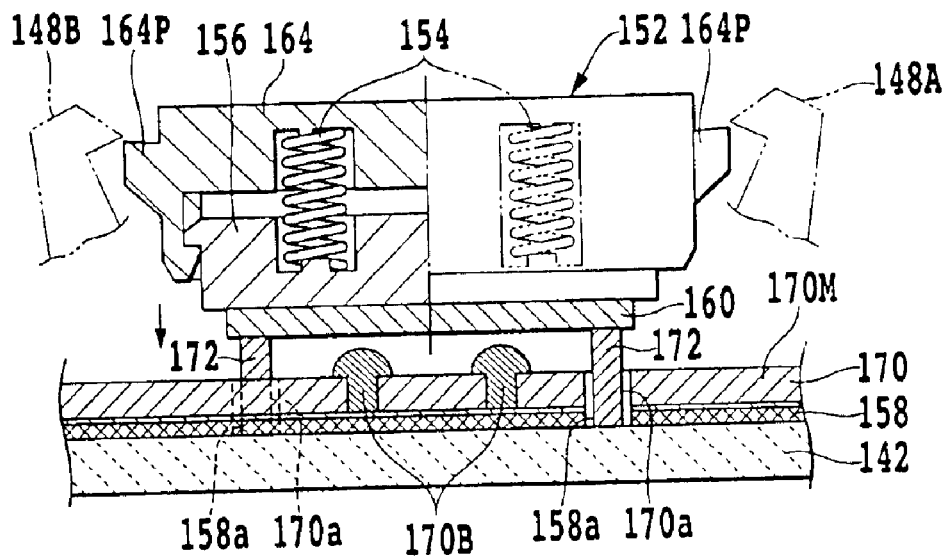
FIGS. 18A and 18B are partially sectional views, respectively, schematically showing an important part of a carrier unit in a fifth embodiment of the carrier unit used for the socket for a semiconductor device according to the present invention.
Figure 18B:
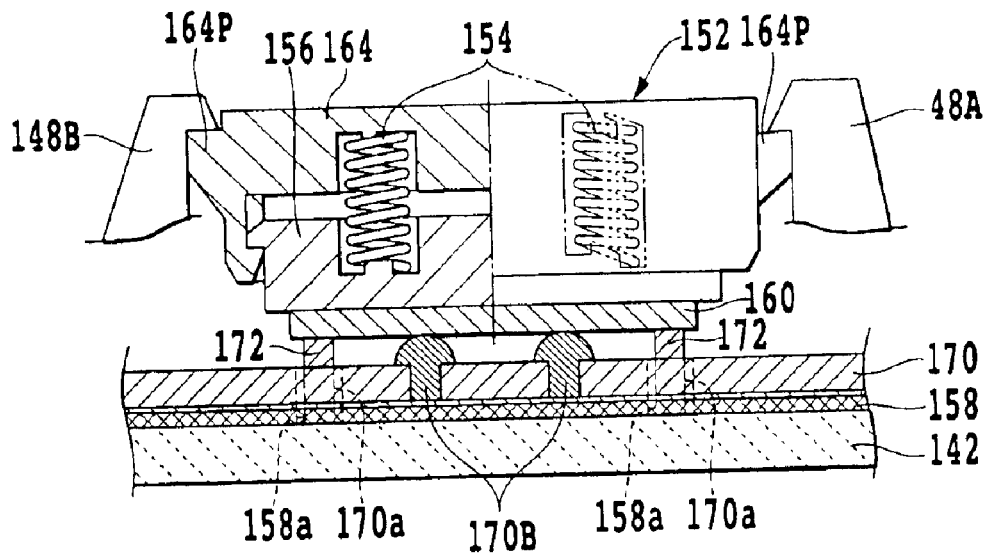

FIGS. 18A and 18B schematically illustrate a fifth embodiment of a carrier unit used for the socket for a semiconductor device according to the present invention. In this regard, in FIGS. 18A and 18B, the same reference numerals are used for denoting the same constituent elements as in the embodiment shown in FIG. 14, and the explanation thereof will be eliminated.

While the dummy bump 162 in the contact sheet 144 shown in FIG. 14 is made of relatively rigid material free from a risk of crush, in the embodiment shown in FIGS. 18A and 18B, four dummy bumps 172 made of elastic material such as silicone rubber are provided in a contact sheet 170.

The contact sheet 170 has a plurality of bumps 170B, in a substrate 170M, arranged in correspondence to the electrode group in the bare chip 160 electrically connected thereto. For example, the respective bump 170B made of solder or others has a diameter at a tip end thereof of approximately 100 μm, and a height from the surface of the substrate 170M of approximately 50 μm. The substrate 170M is made, for example, of polyimide resin to be a sheet of approximately several tens μm thick.

Not illustrated, the respective bump 170B is connected to a pad via a conductor layer made of copper foil. The pads are formed in the opposite end portions of the substrate 170M extended outward from the opposite ends of the base member 142.

The dummy bumps 172 used as a moving amount restriction member are projected from the substrate 170M at positions corresponding to four corners of the bare chip 160. The lowermost end of the dummy bump 172 is fixed to the base member 142 and the upper end thereof is projected outward through small holes 170a and 158a in the substrate 170M of the contact sheet 170 and the elastic body 158, respectively. As shown in FIG. 18A, when the biasing force of the coil springs 154 is not applied, the projected height of the dummy bump 172 is determined to be slightly higher than that of the bump 170B. In addition, as shown in FIG. 18B, when the biasing force of the coil springs 154 is applied, the projected height of the dummy bump 172 is determined to be equal to or slightly lower than that of the bump 170B.

Also in this embodiment, a region in which the dummy bump 162 is positioned is not limited to that shown in this embodiment, but may be a region having no pads or wires, or that in which pads or wire meshes are coated with an insulation coating. Also, material and the number of dummy bumps 172 are not limited to those shown in this embodiment, but other suitable material may be selected, of course, such as solder used for the bumps 170B, having no risk of being crushed while exceeding a predetermined value even if each dummy bumps are subjected to a total load applied to all the bumps 170B with the assumption that a load is applied to the bumps 170B under a pressure of about 10 g per a bump.

In this structure, when the pressing cap 152 is mounted to the carrier housing 46, there is a risk in that the pressing surface of the pressing body 156 presses the bare chip 160 and the bumps 170B in an inclined posture.

In such a case, however, since the dummy dump 172 is provided in the vicinity of the bump 170B, part of the slanted bare chip 160 is brought into contact with a tip end of the dummy dump 172 and presses the same. At this time, a pushed amount of the bare chip 160 is restricted to a predetermined value due to the repulsion of the dummy bump 172.

Figure 19:
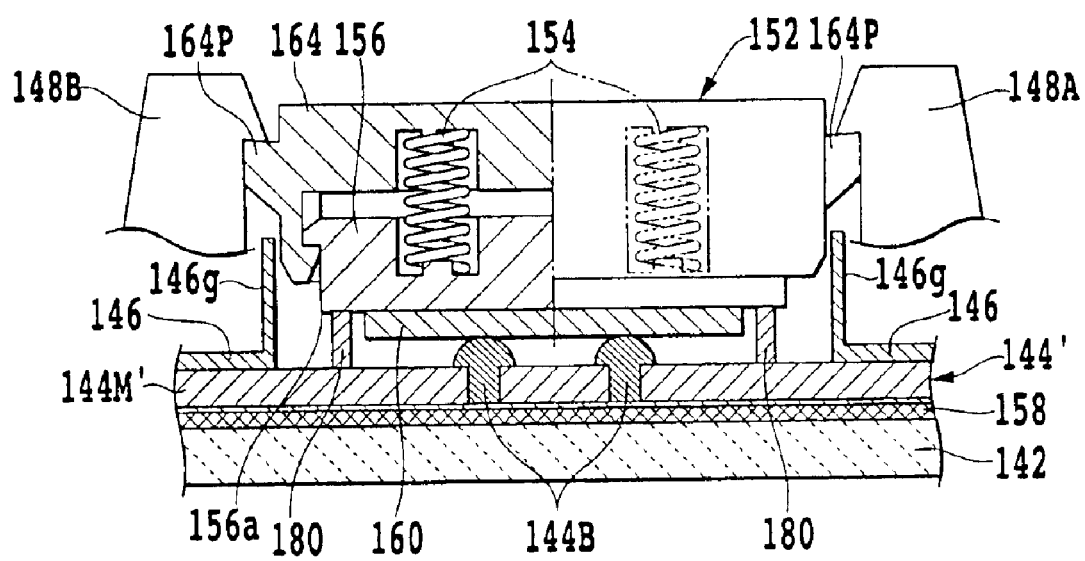
FIG. 19 is a partially sectional view schematically showing a important part of a sixth embodiment of the a carrier unit used for the socket for a semiconductor device according to the present invention.
Figure 20:
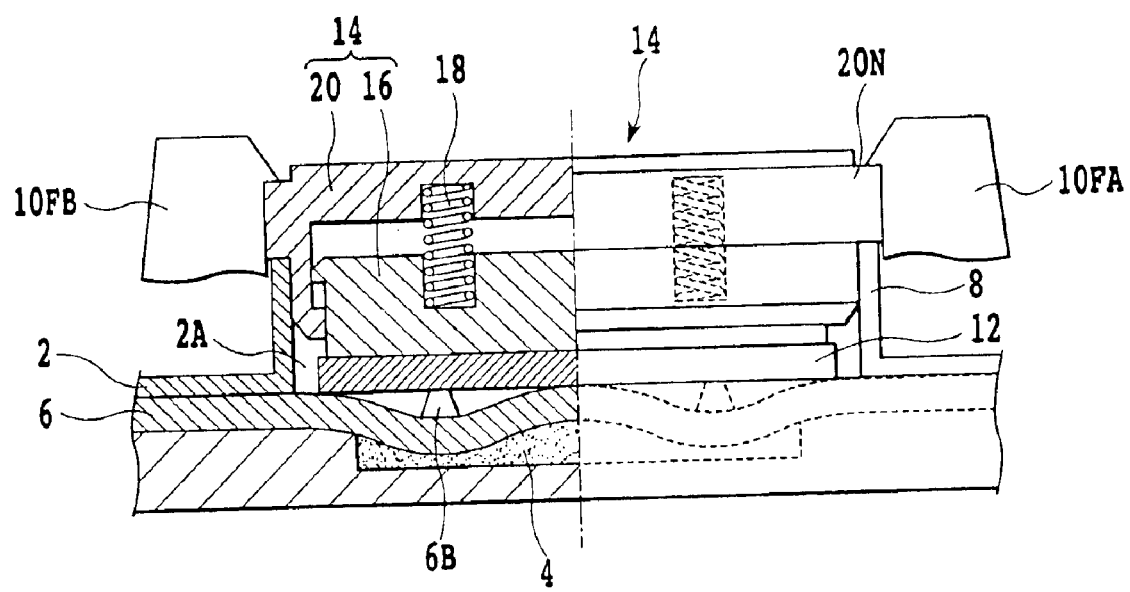
FIG. 20 is a structural drawing showing a configuration of a carrier unit used for the conventional socket for a semiconductor device.
Figure 21:
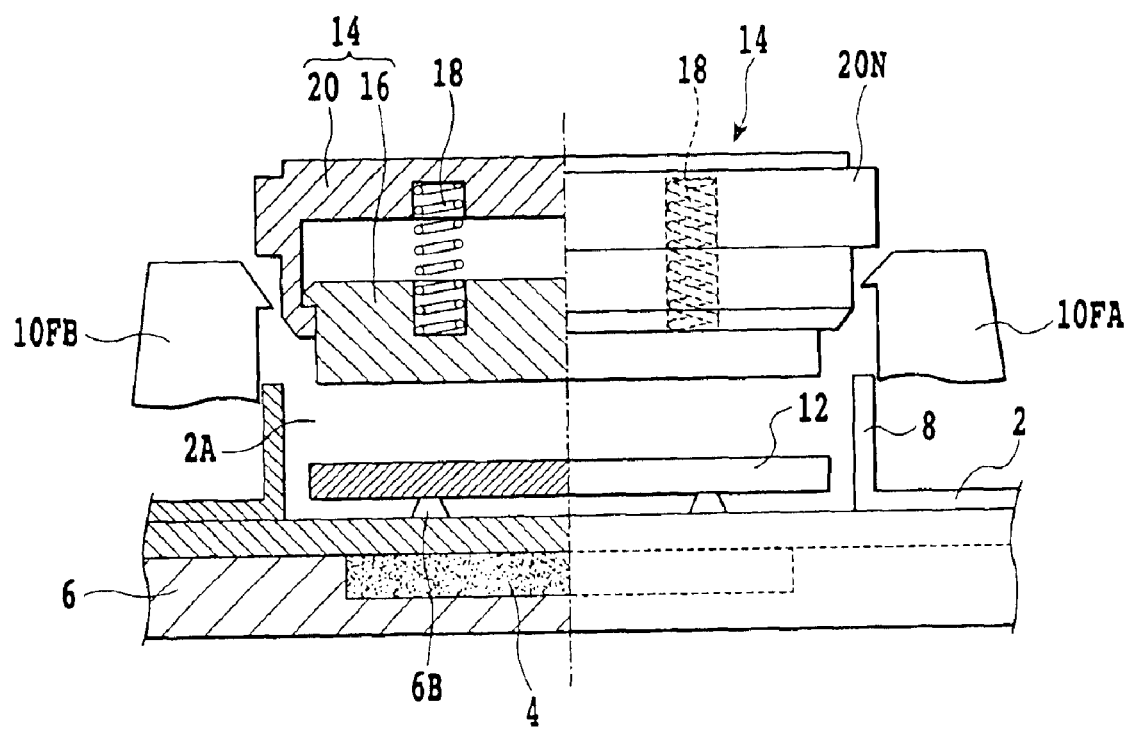
FIG. 21 is a structural drawing made available for explaining the operation of the embodiment shown in FIG. 20.
Figure 22:
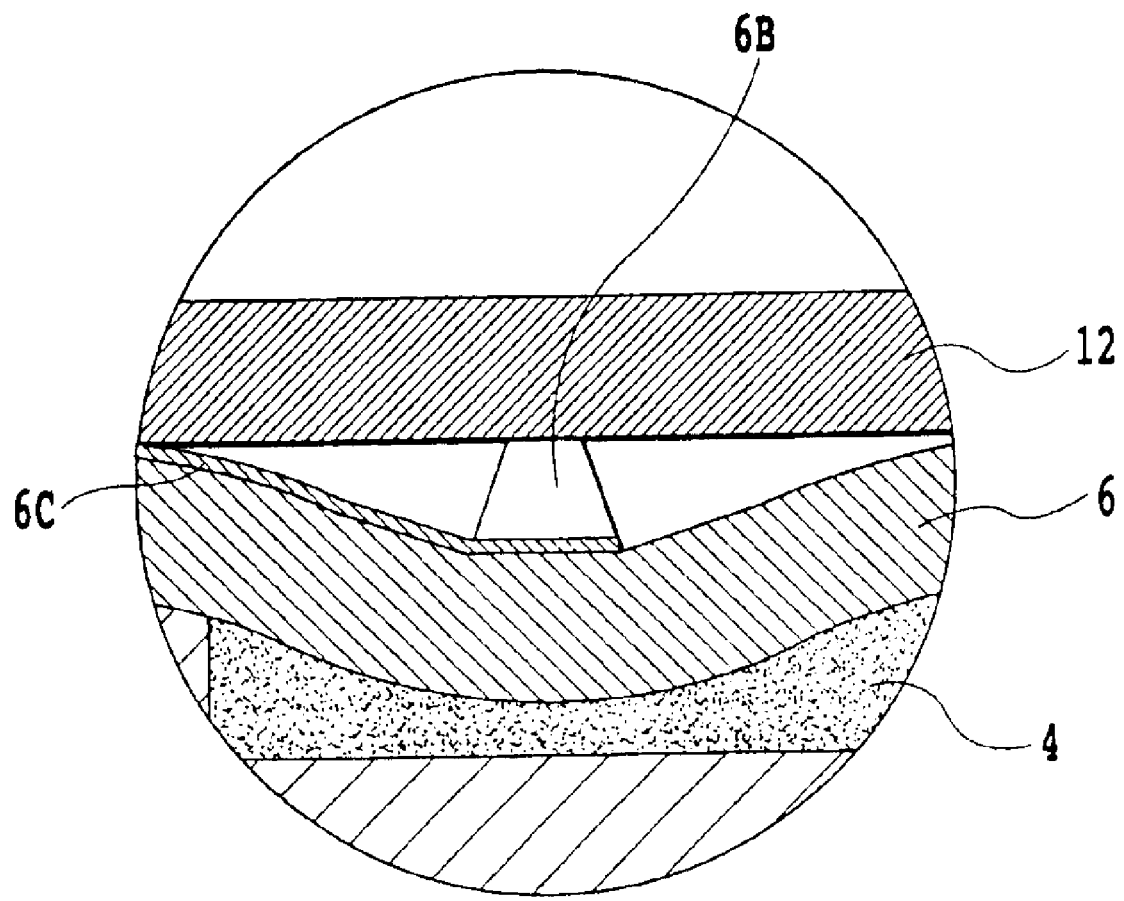
FIG. 22 is an enlarged partially sectional view of part of the contact sheet shown in FIG. 20.
Figure 23:
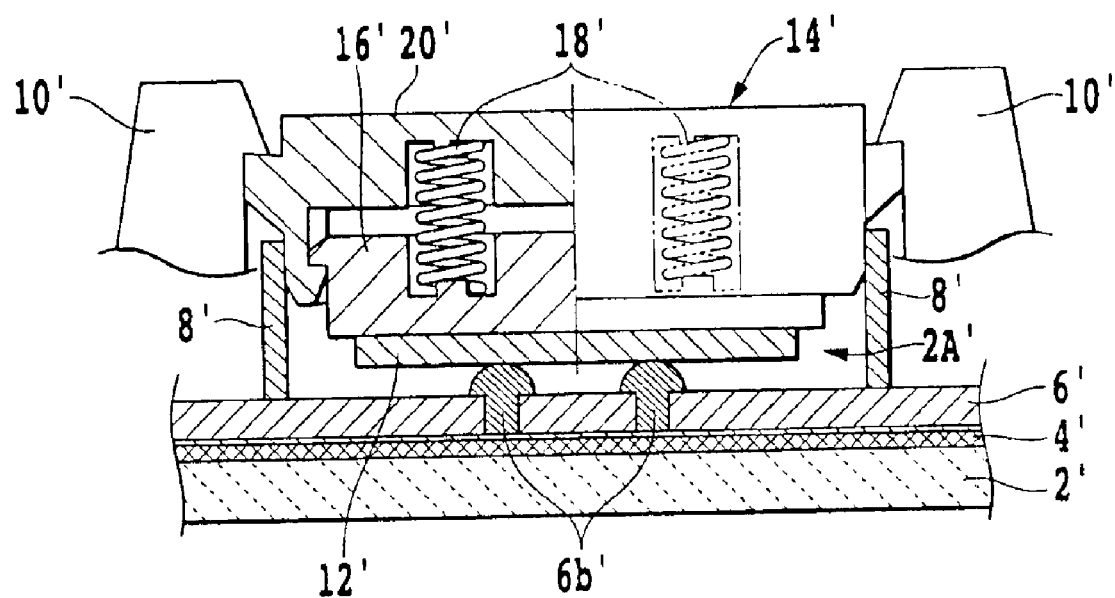
FIG. 23 is a partially sectional view showing structure of the conventional socket for a semiconductor device.

Further, FIG. 19 schematically illustrates a sixth embodiment of a carrier unit used for the socket for a semiconductor device according to the present invention. In this regard, in FIG. 19, the same reference numerals are used for denoting the same constituent elements as in the embodiment shown in FIG. 14, and the explanation thereof will be eliminated.

In the preceding embodiment, the dummy bump 162 in the contact sheet 144 directly restricts the amount of movement of the bare chip 160 by the contact of the upper end of the dummy bump 172 with a surface of the bare chip 160 opposite to the bump 144B. In FIG. 19, however, dummy bumps 180 are provided at four positions in the contact sheet 144' for restricting the movement of the pressing body 156 for the purpose of indirectly restricting an amount of the movement of the bare chip 160. The respective dummy bump 180 is provided in a region directly opposed to the pressing surface 156a of the pressing body 156 while avoiding the interference with the bare chip 160.

A projected height of the dummy bump 180 as a moving amount restriction member from the surface of the substrate 144M' is determined such that a distance between the electrode surface of the bare chip 160 and the surface of the substrate 144M' is equal to or slightly lower than the projected height of the bump 144B when the pressing cap 52 is inserted into the accommodation portion 146A of the carrier housing 146 and held there.

The dummy bump 180 is made of the same material as that of the preceding dummy bump 162 and formed in the same manner as described with reference to FIG. 14.

Accordingly, in this embodiment, the same operation and effect are obtainable as in the preceding embodiment.

In this regard, while the present invention is applied a system in which the carrier unit is mounted to the body section 32 of the IC socket 30 in the preceding embodiments, the present invention should not be limited to this, but may be applied to other systems as a contact sheet itself, of course.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A socket for a semiconductor device comprising:
   a contact sheet having a plurality of bumps to be electrically connected to a terminal group of a semiconductor device, for inputting/outputting signals relative to the semiconductor device;
   a pressing member for pressing terminals of the semiconductor device onto the bumps of the contact sheet;
   an accommodation portion for accommodating the semiconductor device disposed on said contact sheet; and
   a movement-amount controlling member, provided as part of said contact sheet and not electrically connectable to the terminal group, for controlling a movement amount of said semiconductor device along the direction of a projected height of said bump when said pressing member disposed in said accommodation portion is in a pressed state,
   wherein said movement-amount controlling member is disposed on top of said contact sheet.

2. A socket for a semiconductor device as claimed in claim 1, wherein said movement-amount controlling member is formed to be integral with a surface layer of said contact sheet opposite to said bump group.

3. A socket for a semiconductor device as claimed in claim 1, said movement-amount controlling member is formed to be integral with part of said accommodation portion under said contact sheet.

4. A socket for a semiconductor device comprising:
   a contact sheet having a bump group to be electrically connected to a terminal group of said semiconductor device, for inputting/outputting signals relative to said semiconductor device;
   a pressing member for pressing terminals of said semiconductor device onto a bump group of said contact sheet; and
   a contact sheet pressing member for pressing said contact sheet in a direction of a sinking of said contact sheet in the vicinity of said bump group is restricted when the terminals of said semiconductor device are pressed onto said bump group by said pressing member,
   wherein said contact sheet pressing member engages the top of the contact sheet.

5. A socket for a semiconductor device as claimed in claim 4, wherein said contact sheet pressing member is disposed in an accommodation portion for accommodating said semiconductor device and is formed integral with said pressing member.

6. A socket for a semiconductor device as claimed in claim 4, wherein an elastic sheet having the elasticity is disposed directly beneath said contact sheet.

7. A socket for a semiconductor device comprising:
   a contact sheet having a bump group to be electrically connected to a terminal group of said semiconductor device, for inputting/outputting signals relative to said semiconductor device;
   a pressing member for pressing said terminal group of said semiconductor device onto a bump group of said contact sheet; and
   a sinking-amount adjustment section formed opposite to said bump group of said contact sheet, for compensating an amount of sinking of said bump group by applying a force in a direction opposite to the sinking when said terminal group of said semiconductor device is pressed by said pressing member.

8. A socket for a semiconductor device as claimed in claim 7, wherein an elastic sheet having the elasticity is disposed directly beneath said contact sheet.

9. A socket for a semiconductor device as claimed in claim 7, wherein the sinking-amount adjustment section includes at least one convex seat portion formed on a surface layer of said contact sheet opposite to said bump group.

10. A socket for a semiconductor device as claimed in claim 7, wherein the sinking-amount adjustment section includes at least one convex seat portion formed on a bottom of an accommodation portion for accommodating said semiconductor device via said contact sheet.

11. A socket for a semiconductor device comprising:
    a contact sheet having a plurality of bumps to be electrically connected to a terminal group of a semiconductor device, for inputting/outputting signals relative to said semiconductor device,
    a pressing member for pressing terminals of said semiconductor device onto said bumps of said contact sheet;
    an accommodation portion for accommodating said semiconductor device disposed on said contact sheet; and
    a movement-amount restricting member, provided as part of said contact sheet and electrically isolated from the terminal group, for restricting a movement amount of said semiconductor device along the direction of a projected height of said bump when said pressing member disposed in said accommodation portion is in a pressed state,
    wherein said movement-amount restricting member is disposed on top of said contact sheet.

12. A socket for a semiconductor device as claimed in claim 11, wherein said movement-amount restricting member is provided in a region of said contact sheet in the vicinity of said bumps and opposite to said semiconductor device.

13. A socket for a semiconductor device as claimed in claim 12, wherein said movement-amount restricting member is made of material having high rigidity compared with that of said bump.

14. A socket for a semiconductor device as claimed in claim 12, wherein said movement-amount restricting member is made of elastic material.

15. A socket for a semiconductor device comprising;
a contact sheet having a bump group to be electrically connected to a terminal group of said semiconductor device, for inputting/outputting signals relative to said semiconductor device;
a pressing member for pressing said terminal group of said semiconductor device onto a bump group of said contact sheet; and
a sinking-amount adjustment section formed opposite to said bump group of said contact sheet, for adjusting an amount of sinking of said bump group when said terminal group of said semiconductor device is pressed by said pressing member,
wherein the sinking-amount adjustment section includes at least one convex seat portion formed on a surface layer of said contact sheet opposite to said bump group.

16. A socket for a semiconductor device comprising:
a contact sheet having a bump group to be electrically connected to a terminal group of said semiconductor device, for inputting/outputting signals relative to said semiconductor device;
a pressing member for pressing said terminal group of said semiconductor device onto a bump group of said contact sheet; and
a sinking-amount adjustment section formed opposite to said bump group of said contact sheet, for adjusting an amount of sinking of said bump group when said terminal group of said semiconductor device is pressed by said pressing member,
wherein the sinking-amount adjustment section includes at least one convex seat portion formed on a bottom of an accommodation portion for accommodating said semiconductor device via said contact sheet.

17. A socket for a semiconductor device comprising:
a contact sheet having a bump group to be electrically connected to a terminal group of said semiconductor device, for inputting/outputting signals relative to said semiconductor device;
a pressing member for pressing said terminal group of said semiconductor device onto a bump group of said contact sheet; and
a contact sheet pressing member for pressing said contact sheet in a direction of a sinking of said contact sheet in a vicinity of said bump group is restricted when the terminal group of said semiconductor device is pressed onto said bump group by said pressing member,
wherein said contact sheet pressing member engages the contact sheet, and
wherein said contact sheet pressing member is disposed in an accommodation portion for accommodating said semiconductor device and is formed integral with said pressing member.

18. A socket for a semiconductor device comprising:
a contact sheet having a bump group to be electrically connected to a terminal group of a semiconductor device, for inputting/outputting signals relative to said semiconductor device;
a pressing member for pressing terminals of said semiconductor device onto said bump group of said contact sheet; and
a contact sheet pressing member for pressing said contact sheet together with said pressing member a direction of a sinking of said contact sheet in the vicinity of said bump group is restricted and said pressing member presses terminals of said semiconductor when the terminals of said semiconductor device are pressed onto said bump group by said pressing member;
wherein said contact sheet pressing member engages the top of the contact sheet.

19. A socket for a semiconductor device comprising:
a contact sheet having a plurality of bumps to be electrically connected to a terminal group of said semiconductor device, for inputting/outputting signals relative to said semiconductor device,
a pressing member for pressing terminals of said semiconductor device onto said bumps of said contact sheet;
an accommodation portion for accommodating said semiconductor device disposed on said contact sheet; and
a movement amount restricting member, provided as part of said contact sheet and electrically isolated from the terminal group, for restricting a movement amount of said semiconductor device along a direction of a projected height of said bump when said pressing member disposed in said accommodation portion is in a pressed state,
wherein said movement amount restricting member is disposed on top of said contact sheet and said movement amount restricting member is a dummy bump engaged with said semiconductor device or said pressing member.

20. A socket for a semiconductor device comprising:
a contact sheet having a plurality of bumps to be electrically connected to a terminal group of a semiconductor device, for inputting/outputting signals relative to said semiconductor device;
a pressing member for pressing terminals of said semiconductor device onto said bumps of said contact sheet;
an accommodation portion for accommodating said semiconductor device disposed on said contact sheet; and
a movement amount restricting member for restricting a movement amount of said semiconductor device along a direction of a projected height of said bump when said pressing member disposed in said accommodation portion is in a pressed state,
wherein said movement amount restricting member is disposed on top of said contact sheet and said movement amount restricting member interferes with said semiconductor device or said pressing member.

* * * * *

UNITED STATES PATENT AND TRADEMARK OFFICE
CERTIFICATE OF CORRECTION

PATENT NO.     : 6,910,898 B2
DATED          : June 28, 2005
INVENTOR(S)    : Takeyuki Suzuki et al.

It is certified that error appears in the above-identified patent and that said Letters Patent is hereby corrected as shown below:

Column 17,
Line 11, "comprising;" should read -- comprising: --;

Column 18,
Line 12, "member a direction of" should read -- member in a direction of --; and
Line 17, "member;" should read -- member, --.

Signed and Sealed this

Sixth Day of December, 2005

JON W. DUDAS
*Director of the United States Patent and Trademark Office*